(12) United States Patent
Nakajima et al.

(10) Patent No.: US 8,956,934 B2
(45) Date of Patent: Feb. 17, 2015

(54) THIN FILM TRANSISTOR AND METHOD FOR MANUFACTURING THE SAME

(71) Applicant: Semiconductor Energy Laboratory Co., Ltd., Atsugi-shi, Kanagawa-ken (JP)

(72) Inventors: Miyako Nakajima, Kanagawa (JP); Hidekazu Miyairi, Kanagawa (JP); Toshiyuki Isa, Kanagawa (JP); Erika Kato, Kanagawa (JP); Mitsuhiro Ichijo, Kanagawa (JP); Kazutaka Kuriki, Kanagawa (JP); Tomokazu Yokoi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 119 days.

(21) Appl. No.: 13/706,841

(22) Filed: Dec. 6, 2012

(65) Prior Publication Data

US 2013/0095617 A1    Apr. 18, 2013

Related U.S. Application Data

(62) Division of application No. 12/820,201, filed on Jun. 22, 2010, now Pat. No. 8,344,378.

(30) Foreign Application Priority Data

Jun. 26, 2009  (JP) ................. 2009-152370

(51) Int. Cl.
*H01L 29/66* (2006.01)
*H01L 29/04* (2006.01)
(Continued)

(52) U.S. Cl.
CPC ............ *H01L 29/6675* (2013.01); *H01L 29/04* (2013.01); *H01L 29/4908* (2013.01);
(Continued)

(58) Field of Classification Search
CPC .............................. H01L 29/786; H01L 29/66
USPC .......................... 438/158, 149, 153, 154, 151
See application file for complete search history.

(56) References Cited

U.S. PATENT DOCUMENTS 4,409,134 A   10/1983   Yamazaki
5,910,672 A    6/1999   Iwamatsu et al.
(Continued)

FOREIGN PATENT DOCUMENTS

CN    101339905    1/2009
CN    101350367    1/2009
(Continued)

OTHER PUBLICATIONS

Chinese Office Action (Application No. 201010219834.3), dated Dec. 2, 2013.
(Continued)

*Primary Examiner* — Chuong A Luu
(74) *Attorney, Agent, or Firm* — Nixon Peabody LLP; Jeffrey L. Costellia

(57) ABSTRACT

An object is to provide a thin film transistor with small off current, large on current, and high field-effect mobility. A silicon nitride layer and a silicon oxide layer which is formed by oxidizing the silicon nitride layer are stacked as a gate insulating layer, and crystals grow from an interface of the silicon oxide layer of the gate insulating layer to form a microcrystalline semiconductor layer; thus, an inverted staggered thin film transistor is manufactured. Since crystals grow from the gate insulating layer, the thin film transistor can have a high crystallinity, large on current, and high field-effect mobility. In addition, a buffer layer is provided to reduce off current.

10 Claims, 24 Drawing Sheets

(51) Int. Cl.
*H01L 29/49* (2006.01)
*H01L 29/786* (2006.01)

(52) U.S. Cl.
CPC .... *H01L29/66765* (2013.01); *H01L 29/78669* (2013.01); *H01L 29/78678* (2013.01); *H01L 29/78696* (2013.01)
USPC ............ 438/158; 438/149; 438/151; 438/154

(56) References Cited

U.S. PATENT DOCUMENTS

| | | | |
|---|---|---|---|
| 6,171,889 | B1 | 1/2001 | Iwamatsu et al. |
| 7,940,345 | B2 | 5/2011 | Yamazaki |
| 7,998,800 | B2 | 8/2011 | Yamazaki |
| 8,389,343 | B2 | 3/2013 | Yamazaki |
| 2002/0117719 | A1 | 8/2002 | Ando et al. |
| 2003/0038289 | A1* | 2/2003 | Yamazaki et al. ............... 257/72 |
| 2006/0289872 | A1* | 12/2006 | Miyazawa ....................... 257/72 |
| 2009/0002591 | A1 | 1/2009 | Yamazaki et al. |
| 2009/0072237 | A1 | 3/2009 | Yamazaki et al. |
| 2009/0137087 | A1* | 5/2009 | Yamazaki et al. ............. 438/158 |
| 2009/0261328 | A1 | 10/2009 | Miyairi et al. |
| 2009/0261330 | A1 | 10/2009 | Yamazaki et al. |
| 2009/0267068 | A1 | 10/2009 | Dairiki et al. |
| 2009/0277504 | A1 | 11/2009 | Yamazaki |
| 2010/0096631 | A1 | 4/2010 | Miyairi et al. |
| 2010/0096637 | A1 | 4/2010 | Yamazaki et al. |
| 2011/0198595 | A1 | 8/2011 | Yamazaki |

FOREIGN PATENT DOCUMENTS

| | | |
|---|---|---|
| JP | 60-241269 | 11/1985 |
| JP | 63-015468 | 1/1988 |
| JP | 03-041731 | 2/1991 |
| JP | 03-155128 | 7/1991 |
| JP | 6-177142 | 6/1994 |
| JP | 07-094740 | 4/1995 |
| JP | 07-321106 | 12/1995 |
| JP | 10-242468 A | 9/1998 |
| JP | 2009-044134 | 2/2009 |

OTHER PUBLICATIONS

Chinese Office Action (Application No. 201010219834.3), dated Aug. 4, 2014.

* cited by examiner

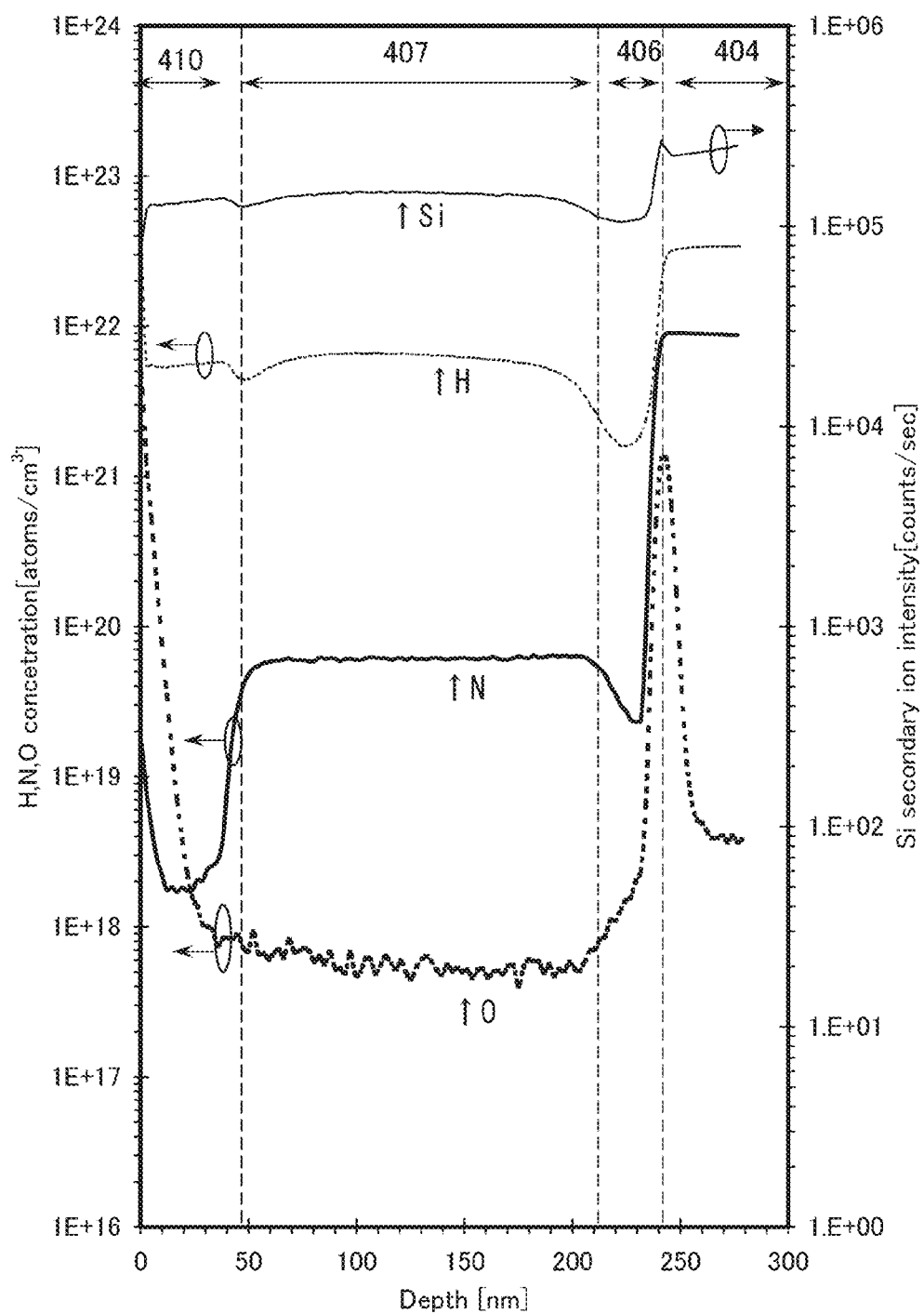

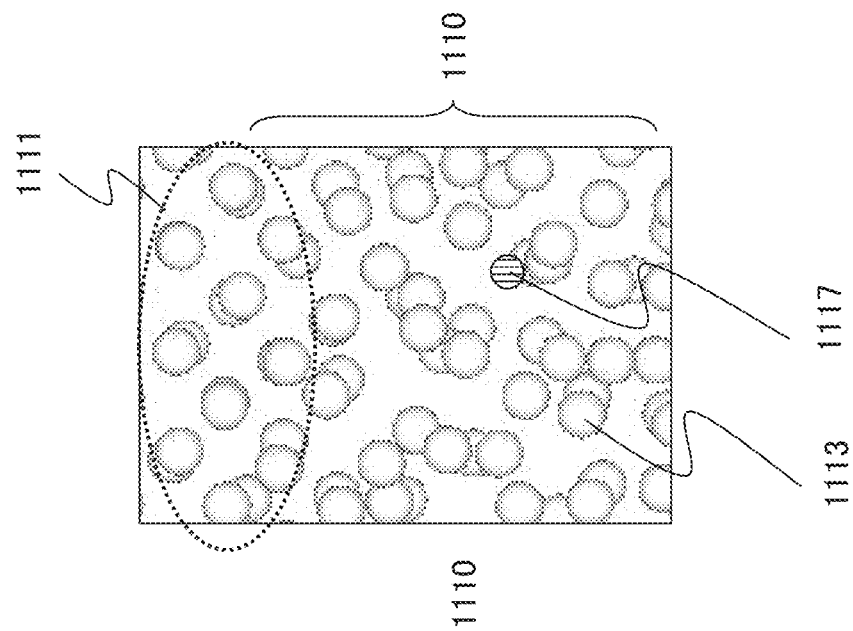
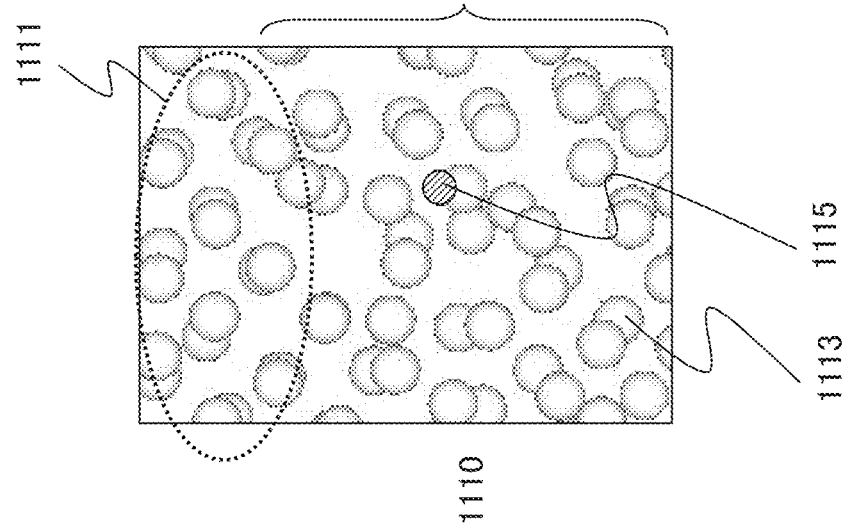
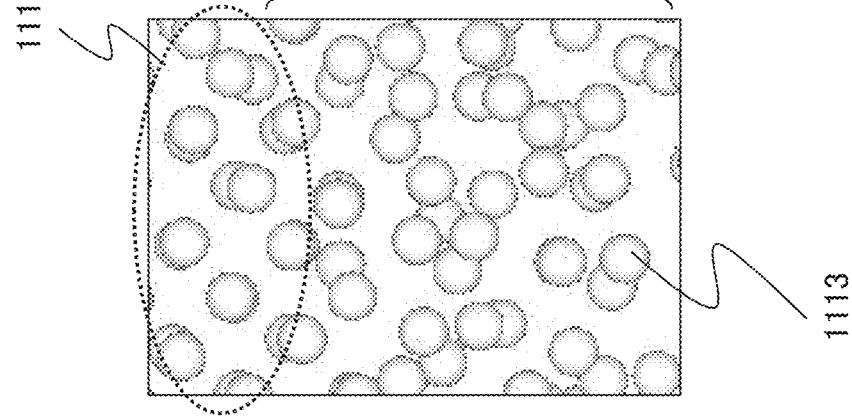

THIN FILM TRANSISTOR AND METHOD FOR MANUFACTURING THE SAME

This case is Division of application Ser. No. 12/820,201, filed on Jun. 22, 2010, now U.S. Pat. No. 8,344,378.

BACKGROUND OF THE INVENTION

1. Field of the Invention

The present invention relates to a thin film transistor and a method for manufacturing the thin film transistor, and a semiconductor device and a display device formed using the thin film transistor.

2. Description of the Related Art

In recent years, a thin film transistor including a thin semiconductor film (with a thickness of several nanometers to several hundreds of nanometers, approximately) over a substrate having an insulating surface (e.g., a glass substrate) has been attracting attention. Thin film transistors are widely used for ICs (integrated circuits) and electronic devices such as electro-optical devices. In particular, thin film transistors are urgently developed as switching elements of image display devices typified by liquid crystal display devices and the like. In an image display device such as a liquid crystal display device, a thin film transistor including an amorphous semiconductor layer or a thin film transistor including a polycrystalline semiconductor layer is mainly used as a switching element.

As a switching element of an image display device, a thin film transistor in which a microcrystalline semiconductor layer is used for a channel formation region is known in addition to a thin film transistor in which an amorphous semiconductor layer is used for a channel formation region and a thin film transistor in which a polycrystalline semiconductor layer is used for a channel formation region (see Patent Document 1).

Further, there is a method in which characteristics of a thin film transistor are improved by exposure of the thin film transistor to an atmosphere containing oxygen ions and oxygen active species generated by plasma discharge in a gas containing oxygen (see Patent Document 2).

REFERENCE

Patent Document

[Patent Document 1] Japanese Published Patent Application No. 2009-044134
[Patent Document 2] Japanese Published Patent Application No. H6-177142

SUMMARY OF THE INVENTION

An object of one embodiment of the present invention is to reduce off current of a thin film transistor and to increase on current and field-effect mobility.

Another object of one embodiment of the present invention is to increase productivity of a thin film transistor with small off current, large on current, and high field-effect mobility.

One embodiment of the present invention is an inverted staggered thin film transistor in which a silicon nitride layer and a silicon oxide layer formed by oxidizing a surface of the silicon nitride layer are stacked as a gate insulating layer and crystals grow from an interface of the silicon oxide layer of the gate insulating layer to form a microcrystalline semiconductor layer.

Another embodiment of the present invention is a thin film transistor including a gate electrode, a gate insulating layer which covers the gate electrode, a semiconductor layer including a microcrystalline semiconductor layer over the gate insulating layer, and a source region and a drain region which are in contact with the semiconductor layer. The nitrogen concentration at an interface between the gate insulating layer and the microcrystalline semiconductor layer is higher than or equal to $5\times10^{19}$ atoms/cm$^3$ and lower than or equal to $1\times10^{22}$ atoms/cm$^3$. The nitrogen concentration in the microcrystalline semiconductor layer reaches the minimum value, which is higher than or equal to $1\times10^{17}$ atoms/cm$^3$ and lower than or equal to $3\times10^{19}$ atoms/cm$^3$.

Another embodiment of the present invention is a thin film transistor including a gate electrode, a gate insulating layer which covers the gate electrode, a first semiconductor layer which is formed using a microcrystalline semiconductor layer over the gate insulating layer, a second semiconductor layer which includes a conical or pyramidal crystal region and an amorphous semiconductor region over the first semiconductor layer, and a source region and a drain region which are in contact with the second semiconductor layer. The nitrogen concentration at an interface between the gate insulating layer and the first semiconductor layer is higher than or equal to $5\times10^{19}$ atoms/cm$^3$ and lower than or equal to $1\times10^{22}$ atoms/cm$^3$. The nitrogen concentration in the first semiconductor layer reaches the minimum value, which is higher than or equal to $1\times10^{17}$ atoms/cm$^3$ and lower than or equal to $3\times10^{19}$ atoms/cm$^3$. The nitrogen concentration in the second semiconductor layer is higher than or equal to $1\times10^{19}$ atoms/cm$^3$ and lower than or equal to $1\times10^{21}$ atoms/cm$^3$. The oxygen concentration at an interface between the gate insulating layer and the first semiconductor layer is higher than or equal to $1\times10^{19}$ atoms/cm$^3$ and lower than or equal to $1\times10^{22}$ atoms/cm$^3$. The oxygen concentration in the second semiconductor layer is lower than or equal to $1\times10^{18}$ atoms/cm$^3$.

As a method for oxidation treatment of the silicon nitride layer which is part of the gate insulating layer, there is a method in which the silicon nitride layer is exposed to plasma generated in an atmosphere containing oxygen. When the silicon nitride layer is exposed to plasma generated in an atmosphere containing oxygen, a treatment chamber where the silicon nitride layer is formed or another treatment chamber may be used. When the silicon nitride layer is exposed to plasma generated in an atmosphere containing oxygen, the substrate provided with the silicon nitride layer is not carried out of a vacuum apparatus and thus throughput is high, which is preferable.

As another method for oxidation treatment of the silicon nitride layer which is part of the gate insulating layer, there is a method in which the silicon nitride layer is exposed to an atmosphere containing ozone.

As another method for oxidation treatment of the silicon nitride layer which is part of the gate insulating layer, there is a method in which the silicon nitride layer is soaked in ozone water or the like.

Alternatively, the silicon oxide layer may be formed over the silicon nitride layer by a CVD method.

The silicon oxide layer may have a thickness which enables the silicon oxide layer to cover a surface of the silicon nitride layer and which does not take long time for etching the gate insulating layer which is performed to expose the gate electrode layer (that is, time for etching the silicon oxide layer is approximately same as that for etching the silicon nitride layer). The silicon oxide layer is preferably formed to have a thickness of greater than or equal to 2 nm and less than 10 nm.

As the gate insulating layer, the silicon oxide layer is stacked over the silicon nitride layer, so that the nitrogen concentration at an interface between the gate insulating layer and the first semiconductor layer formed using a microcrystalline semiconductor can be reduced, and crystals grow from a surface of the gate insulating layer to form a microcrystalline semiconductor layer as the first semiconductor layer. When the uppermost layer of the gate insulating layer is a silicon oxide layer with a thickness of greater than or equal to 2 nm and less than 10 nm, reduction in throughput in an etching process for exposing the gate electrode can be prevented.

It is possible to reduce off current of a thin film transistor and to increase on current and field-effect mobility. Further, a thin film transistor with small off current, large on current, and high field-effect mobility can be manufactured with high productivity.

BRIEF DESCRIPTION OF THE DRAWINGS

In the accompanying drawings:

FIG. 9 illustrates concentrations of elements included in a gate insulating layer, a first semiconductor layer, and a second semiconductor layer;

FIGS. 21A to 21C illustrate simulation results of a crystallization process of a microcrystalline semiconductor layer;

DETAILED DESCRIPTION OF THE INVENTION

Figure 1A:
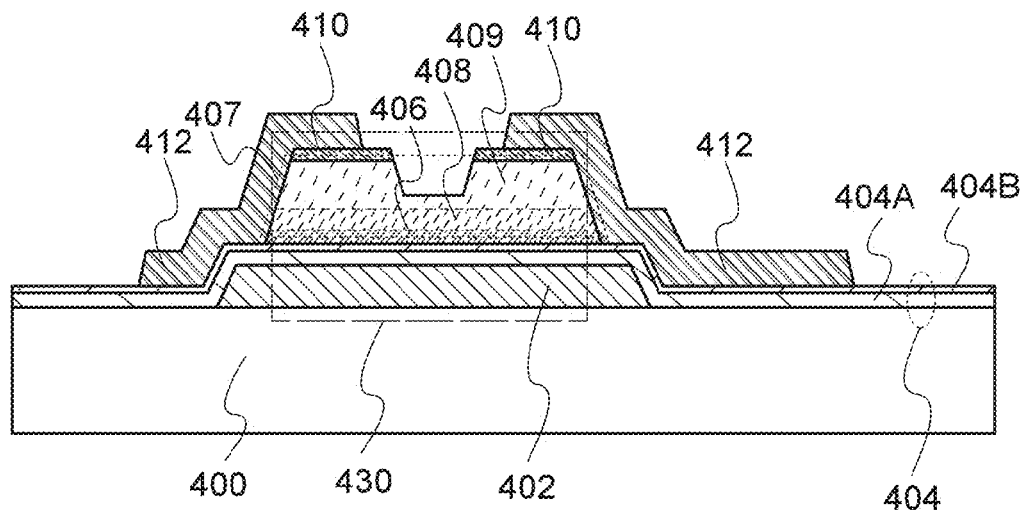
FIGS. 1A and 1B each illustrate a thin film transistor.

Hereinafter, embodiments and examples of the present invention are described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments and examples below. In describing structures of the present invention with reference to drawings, the same reference numerals are used in common for the same portions in different drawings. Note that the same hatch pattern is applied to similar parts, and the similar parts are not especially denoted by reference numerals in some cases. In addition, an insulating layer is not illustrated in a top view for convenience in some cases. Note that the size, the thickness of a layer, or a region of each structure illustrated in drawings are exaggerated for simplicity in some cases. Therefore, the present invention is not necessarily limited to such scales illustrated in the drawings.

Embodiment 1

Figure 1B:
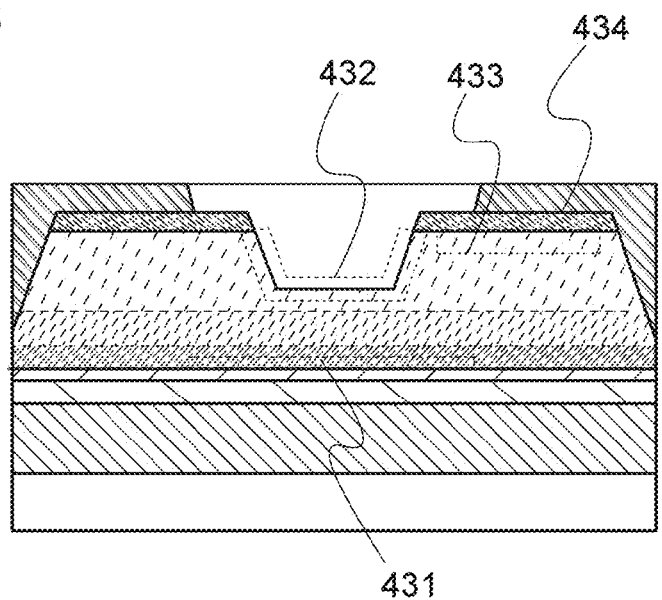

FIGS. 1A and 1B each illustrate a cross-sectional view of a thin film transistor which is one embodiment of the present invention. A thin film transistor illustrated in FIG. 1A includes, over a substrate 400, a gate electrode layer 402, a gate insulating layer 404 which covers the gate electrode layer 402, a semiconductor layer in which a first semiconductor layer 406 and a second semiconductor layer 407 are stacked over the gate insulating layer 404, source and drain regions 410 which are provided in contact with the semiconductor layer, and source and drain electrode layers 412 which are provided in contact with the source and drain regions 410. The second semiconductor layer 407 is provided by stacking a mixed region 408 and a region 409 including an amorphous semiconductor. The gate insulating layer 404 is provided by stacking a silicon nitride layer 404A and a silicon oxide layer 404B.

FIG. 1B is an enlarged view of a rectangular region 430 illustrated in FIG. 1A. Part 431 of a channel formation region, a back channel portion 432, a depletion layer 433, and a bond region 434 are illustrated in FIG. 1B.

The part 431 of a channel formation region is overlapped with the gate electrode layer 402 and formed on the gate insulating layer 404 side. The back channel portion 432 is formed in an exposed region of the region 409 including an amorphous semiconductor between the source and drain regions. The depletion layer 433 is formed in the vicinity of a portion of the region 409 including an amorphous semiconductor in contact with the drain region. The bond region 434 is formed in a portion where the region 409 including an amorphous semiconductor is in contact with the source or drain region.

One of features of the thin film transistor of this embodiment is that the gate insulating layer of the thin film transistor is provided by stacking the silicon nitride layer 404A and the silicon oxide layer 404B.

The silicon nitride layer 404A is formed using silicon nitride or silicon nitride oxide. The thickness of the silicon nitride layer 404A is 50 nm or more, preferably 50 nm to 400 nm inclusive, more preferably 150 nm to 300 nm inclusive.

The silicon nitride layer 404A is provided between the substrate 400 and the first semiconductor layer 406, so that impurities (particularly an alkali metal ion or the like included in the substrate 400) from the substrate 400 can be prevented from being mixed into the first semiconductor layer 406 which is formed in a later step; therefore, fluctuation in the threshold voltage of the thin film transistor can be reduced.

The silicon oxide layer 404B is formed using silicon oxide or silicon oxynitride. The silicon oxide layer 404B may have a thickness which enables the silicon oxide layer 404B to retain a film shape to cover a surface of the silicon nitride layer 404A and which does not reduce throughput extremely due to increase in time for etching the gate insulating layer 404 which is performed to expose the gate electrode layer 402 to be described later (that is, a thickness with which the time for etching the silicon oxide layer 404B is approximately the same as that for etching the silicon nitride layer 404A). The thickness of the silicon oxide layer 404B is preferably greater than or equal to 2 nm and less than 10 nm.

In this specification, silicon oxynitride contains more oxygen than nitrogen, and in the case where measurements are conducted using Rutherford backscattering spectrometry (RBS) and hydrogen forward scattering spectrometry (HFS), silicon oxynitride preferably contains oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Silicon nitride oxide contains more nitrogen than oxygen, and in the case where measurements are conducted using RBS and HFS, silicon nitride oxide preferably contains oxygen, nitrogen, silicon, and hydrogen as composition ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

Here, the nitrogen concentration and the oxygen concentration from the gate insulating layer 404 to the second semiconductor layer 407 are described with reference to FIG. 9.

FIG. 9 shows results of analysis by secondary ion mass spectrometry of a sample formed by stacking an insulating layer to be the gate insulating layer 404, a semiconductor layer to be the first semiconductor layer 406, a semiconductor layer to be the second semiconductor layer 407, and an impurity semiconductor layer to be the source and drain regions 410 in this order over the substrate 400. The horizontal axis represents the depth from the surface of the sample. The vertical axis on the left side represents the concentrations of hydrogen, nitrogen, and oxygen. The vertical axis on the right side represents the secondary ion intensity of silicon. A depressed portion at a depth of approximately 45 nm to 50 nm in the secondary ion intensity of silicon is an interface between the second semiconductor layer 407 and the source and drain regions 410. A peak portion at a depth of approximately 240 nm to 245 nm in the secondary ion intensity of silicon is an interface between the gate insulating layer 404 and the first semiconductor layer 406. Here, the thickness of the first semiconductor layer 406 is approximately 30 nm; accordingly, it is estimated that an interface between the first semiconductor layer 406 and the second semiconductor layer 407 is at a depth of approximately 210 nm to 215 nm.

According to FIG. 9, the nitrogen concentration sharply decreases at the interface between the gate insulating layer 404 and the first semiconductor layer 406, and then gradually increases toward the second semiconductor layer 407. Specifically, the nitrogen concentration reaches the minimum value in the first semiconductor layer 406. Note that the nitrogen concentration is substantially constant in the second semiconductor layer 407.

The oxygen concentration sharply increases at the interface between the gate insulating layer 404 and the first semiconductor layer 406 and then sharply decreases. After that, the oxygen concentration gradually decreases toward the second semiconductor layer 407. Specifically, the oxygen concentration reaches the minimum value also in the first semiconductor layer 406. Note that the oxygen concentration is substantially constant in the second semiconductor layer 407.

The nitrogen concentration at the interface between the gate insulating layer 404 and the first semiconductor layer 406 (the nitrogen concentration before rapid decrease) is higher than or equal to $5 \times 10^{19}$ atoms/cm$^3$ and lower than or equal to $1 \times 10^{22}$ atoms/cm$^3$. The minimum value of the nitrogen concentration in the first semiconductor layer 406 is higher than or equal to $1 \times 10^{17}$ atoms/cm$^3$ and lower than or equal to $3 \times 10^{19}$ atoms/cm$^3$. The nitrogen concentration in the second semiconductor layer 407 is higher than or equal to $1 \times 10^{19}$ atoms/cm$^3$ and lower than or equal to $1 \times 10^{21}$ atoms/cm$^3$.

The oxygen concentration at the interface between the gate insulating layer 404 and the first semiconductor layer 406 is higher than or equal to $1 \times 10^{19}$ atoms/cm$^3$ and lower than or equal to $1 \times 10^{22}$ atoms/cm$^3$. The oxygen concentration in the second semiconductor layer 407 is lower than or equal to $1 \times 10^{18}$ atoms/cm$^3$.

In the case where a microcrystalline semiconductor is formed as the first semiconductor layer 406, the crystal growth rate decreases when the nitrogen concentration is high and crystal growth does not proceed at an early stage of deposition of the microcrystalline semiconductor, resulting in formation of an amorphous semiconductor. However, nitrogen is contained in the first semiconductor layer 406 so that the minimum value of the nitrogen concentration is higher than or equal to $1 \times 10^{17}$ atoms/cm$^3$ and lower than or equal to $3 \times 10^{19}$ atoms/cm$^3$, whereby the nitrogen concentration at the interface between the gate insulating layer 404 and the first semiconductor layer 406 can be reduced and crystals of the first semiconductor layer 406 can grow from a surface of the gate insulating layer 404. Moreover, the oxygen concentration at the interface between the gate insulating layer 404 and the first semiconductor layer 406 is set to higher than or equal to $1 \times 10^{19}$ atoms/cm$^3$ and lower than or equal to $1 \times 10^{22}$ atoms/cm$^3$, whereby a microcrystalline semiconductor layer having high crystallinity can be formed as the first semiconductor layer 406. Accordingly, on current and field-effect mobility of the thin film transistor can be increased.

Further, the nitrogen concentration increases at the interface between the first semiconductor layer 406 and the second semiconductor layer 407 and the nitrogen concentration in the second semiconductor layer 407 is made to be constant, whereby the mixed region 408 including a microcrystalline semiconductor region and an amorphous semiconductor region is formed and then the region 409 including a well-ordered amorphous semiconductor which has few defects and a steep tail of a level at a band edge in the valence band is formed. As a result, in the thin film transistor, when voltage is applied to a source or drain electrode, resistance between the gate insulating layer and the source and drain regions can be reduced and a back channel portion includes few defects, whereby off current of the thin film transistor can be reduced.

As the substrate 400, any of the following substrates can be used: an alkali-free glass substrate formed using barium borosilicate glass, aluminoborosilicate glass, aluminosilicate glass, or the like by a fusion method or a float method; a ceramic substrate; a plastic substrate having heat resistance enough to withstand a process temperature of a process for manufacturing the thin film transistor disclosed in this embodiment; and the like. Alternatively, a metal substrate of a stainless steel alloy or the like with a surface provided with an insulating layer may be used. That is, a substrate having an insulating surface is used as the substrate 400. When the substrate 400 is mother glass, the substrate may have any size of the first generation (e.g., 320 mm×400 mm) to the tenth generation (e.g., 2950 mm×3400 mm), and the like.

The gate electrode layer 402 may be formed using a conductive material. As an example of the conductive material, a metal material such as molybdenum, titanium, chromium, tantalum, tungsten, aluminum, copper, neodymium, or scandium or an alloy material containing any of these materials as a main component can be used. Alternatively, crystalline silicon to which an impurity element imparting one conductivity type is added may be used for the gate electrode layer 402. Note that the gate electrode layer 402 may have a single layer structure or a structure in which a plurality of layers are stacked. For example, a two-layer structure in which a titanium layer or a molybdenum layer is stacked over an aluminum layer or a copper layer may be used. Alternatively, a three-layer structure in which an aluminum layer or a copper layer is sandwiched between titanium layers or molybdenum layers may be used. Further, a titanium nitride layer may be used instead of a titanium layer. Note that the conductive material is not limited to the above described materials.

Next, the first semiconductor layer 406 and the second semiconductor layer 407 are described with reference to FIGS. 2A and 2B, FIG. 3, and FIGS. 4A and 4B. FIGS. 2A and 2B, FIG. 3, and FIGS. 4A and 4B each illustrate an enlarged view of a region between the gate insulating layer 404 and the source and drain regions 410 in FIGS. 1A and 1B.

A microcrystalline semiconductor included in the first semiconductor layer 406 has crystalline structures (including single crystal and polycrystal). A microcrystalline semiconductor is a semiconductor having a third state that is stable in terms of free energy and a crystalline semiconductor having short-range order and lattice distortion, in which columnar or needle-like crystals having a crystal grain size of 2 nm to 200 nm inclusive, preferably 10 nm to 80 nm inclusive, more preferably 20 nm to 50 nm inclusive, grow in a normal direction with respect to a substrate surface. Therefore, there is a case where crystal grain boundaries are formed at the interface of columnar or needle-like crystals. As a typical example of a microcrystalline semiconductor, microcrystalline silicon, microcrystalline silicon germanium, microcrystalline germanium, or the like can be given. Note that an impurity element serving as a donor may be included in the microcrystalline semiconductor. Typical examples of the impurity element serving as a donor include phosphorus, arsenic, and antimony which are Group 15 elements of the periodic table, and the like. An impurity element serving as an acceptor may be included in the microcrystalline semiconductor in order to control the threshold value of the thin film transistor. Boron is given as an example of the impurity element serving as an acceptor.

Microcrystalline silicon which is a typical example of the microcrystalline semiconductor has a peak of Raman spectrum which is shifted to a lower wave number side than 520 cm$^{-1}$ that represents single crystal silicon. That is, microcrystalline silicon has the peak of the Raman spectrum between 520 cm$^{-1}$ that represents single crystal silicon and 480 cm$^{-1}$ that represents amorphous silicon. The microcrystalline semiconductor may contain hydrogen or halogen of at least 1 atomic % to terminate a dangling bond. Moreover, a rare gas element such as helium, argon, krypton, or neon may be included in the source gas to further promote lattice distortion, so that stability of the structure of microcrystals is enhanced and a microcrystalline semiconductor with favorable characteristics can be obtained. Such a microcrystalline semiconductor is disclosed in, for example, U.S. Pat. No. 4,409,134.

The thickness of the first semiconductor layer 406 is preferably greater than or equal to 3 nm and less than or equal to 100 nm, more preferably greater than or equal to 5 nm and less than or equal to 50 nm. In the case where the first semiconductor layer 406 is too thin, on current of the thin film transistor is reduced. In the case where the first semiconductor layer 406 is too thick, off current of the thin film transistor is increased when the thin film transistor operates at a high temperature. Therefore, the thickness of the first semiconductor layer 406 is set to greater than or equal to 3 nm and less than or equal to 100 nm, preferably greater than or equal to 5 nm and less than or equal to 50 nm, so that on current and off current of the thin film transistor can be adjusted to appropriate values.

Although the first semiconductor layer 406 illustrated in FIGS. 1A and 1B, FIGS. 2A and 2B, FIG. 3, and FIGS. 4A and 4B has a layered structure, microcrystalline semiconductor particles may be dispersed over the gate insulating layer 404. In this case, the mixed region 408 is made to be in contact with the microcrystalline semiconductor particles and the gate insulating layer 404.

Each of the microcrystalline semiconductor particles can exist independently when the size of the microcrystalline semiconductor particle is set to greater than or equal to 1 nm and less than or equal to 30 nm and the number of the particles per unit area is set to less than $1\times10^{13}$/cm$^2$, preferably less than $1\times10^{10}$/cm$^2$.

As described above, the second semiconductor layer 407 includes nitrogen. The concentration of nitrogen included in the second semiconductor layer 407 is set to higher than or equal to $1\times10^{19}$ atoms/cm$^3$ and lower than or equal to $1\times10^{21}$ atoms/cm$^3$, preferably higher than or equal to $1\times10^{20}$ atoms/cm$^3$ and lower than or equal to $1\times10^{21}$ atoms/cm$^3$, more preferably higher than or equal to $2\times10^{20}$ atoms/cm$^3$ and lower than or equal to $1\times10^{21}$ atoms/cm$^3$.

Figure 2A:
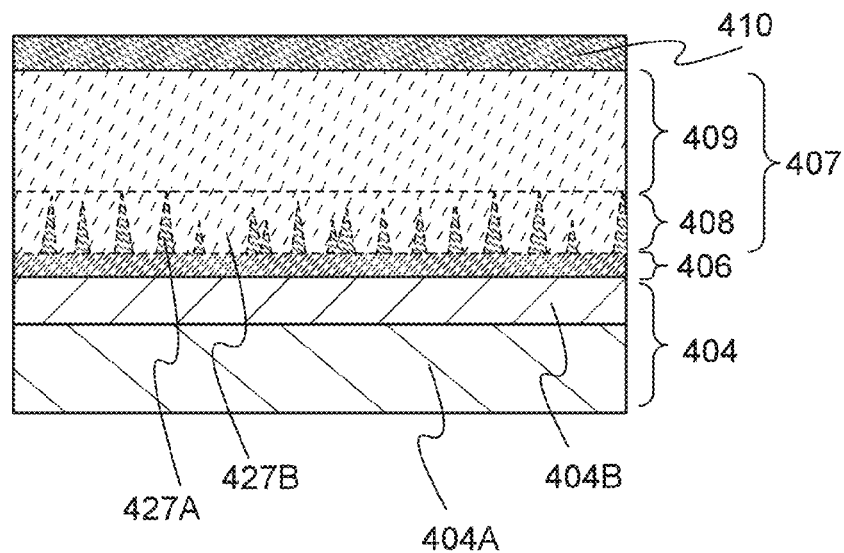
FIGS. 2A and 2B each illustrate a semiconductor layer included in a thin film transistor.

As illustrated in FIG. 2A, the mixed region 408 includes a microcrystalline semiconductor region 427A which grows into a projecting shape from a surface of the first semiconductor layer 406 and an amorphous semiconductor region 427B which fills a space between the microcrystalline semiconductor regions 427A. The region 409 including an amorphous semiconductor is formed using the semiconductor material similar to that of the amorphous semiconductor region 427B.

The thickness of the second semiconductor layer 407 is preferably greater than or equal to 50 nm and less than or equal to 350 nm, more preferably greater than or equal to 120 nm and less than or equal to 250 nm.

The microcrystalline semiconductor region 427A is a microcrystalline semiconductor having a projecting (conical or pyramidal) shape whose end is narrowed from the gate insulating layer 404 toward the region 409 including an amorphous semiconductor. Note that the microcrystalline semiconductor region 427A may be a microcrystalline semiconductor which has a projecting (inverted conical or inverted pyramidal) shape having a width increased from the gate insulating layer 404 toward the region 409 including an amorphous semiconductor.

Note that the amorphous semiconductor region 427B included in the mixed region 408 may contain a semiconductor crystal grain having a grain size of 1 nm to 10 nm inclusive, preferably 1 nm to 5 nm inclusive.

Figure 2B:
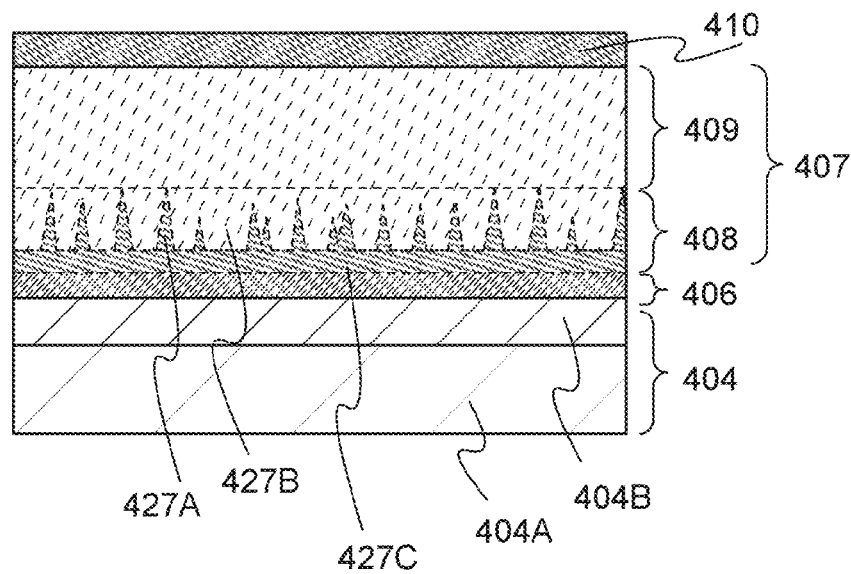

Alternatively, as illustrated in FIG. 2B, the mixed region 408 includes a microcrystalline semiconductor region 427C and the microcrystalline semiconductor region 427A which are successively formed, in some cases. The microcrystalline semiconductor region 427C is deposited with a uniform thickness over the first semiconductor layer 406. The microcrystalline semiconductor region 427A has a projecting (conical or pyramidal) shape whose end is narrowed from the gate insulating layer 404 toward the region 409 including an amorphous semiconductor.

Note that, in FIGS. 2A and 2B, the amorphous semiconductor region 427B included in the mixed region 408 is a semiconductor, the quality of which is substantially the same as the quality of the region 409 including an amorphous semiconductor.

According to the above, an interface between a region formed using a microcrystalline semiconductor and a region formed using an amorphous semiconductor may correspond to the interface between the microcrystalline semiconductor region 427A and the amorphous semiconductor region 427B in the mixed region 408. Therefore, the interface between the microcrystalline semiconductor region and the amorphous semiconductor region can be described as uneven or zigzag in a cross-sectional view.

In the mixed region 408, in the case where the microcrystalline semiconductor region 427A is a semiconductor crystal grain having a projecting (conical or pyramidal) shape whose end is narrowed from the gate insulating layer 404 toward the region 409 including an amorphous semiconductor, the proportion of the microcrystalline semiconductor in the vicinity of the first semiconductor layer 406 is higher than that in the vicinity of the region 409 including an amorphous semiconductor. The microcrystalline semiconductor region 427A grows in a thickness direction from the surface of the first semiconductor layer 406. However, crystal growth of the microcrystalline semiconductor region 427A is suppressed by adding a gas containing nitrogen to the source gas or by adding a gas containing nitrogen to the source gas and reducing the flow rate of hydrogen to silane from that under the condition for forming the first semiconductor layer 406, the semiconductor crystal grain becomes a conical or pyramidal shape, and the amorphous semiconductor is gradually deposited. This is because the solid solubility of nitrogen in the microcrystalline semiconductor region is lower than the solid solubility of nitrogen in the amorphous semiconductor region.

The total thickness of the first semiconductor layer 406 and the mixed region 408, that is, the distance from the interface between the gate insulating layer 404 and the silicon oxide layer 404B to the tip of the projection (projecting portion) of the mixed region 408, is set to greater than or equal to 3 nm and less than or equal to 410 nm, preferably greater than or equal to 20 nm and less than or equal to 100 nm. The total thickness of the first semiconductor layer 406 and the mixed region 408 is set to greater than or equal to 3 nm and less than or equal to 410 nm, preferably greater than or equal to 20 nm and less than or equal to 100 nm, so that off current of the thin film transistor can be reduced.

As described above, the region 409 including an amorphous semiconductor is a semiconductor, the quality of which is substantially the same as the quality of the amorphous semiconductor region 427B, and contains nitrogen. Further, the region 409 including an amorphous semiconductor contains a semiconductor crystal grain having a grain size of 1 nm to 10 nm inclusive, preferably 1 nm to 5 nm inclusive, in some cases. Here, the region 409 including an amorphous semiconductor is a semiconductor layer having lower energy at an Urbach edge and a smaller amount of the absorption spectrum of defects, measured by a constant photocurrent method (CPM) or photoluminescence spectroscopy, as compared to a conventional amorphous semiconductor. That is, as compared to the conventional amorphous semiconductor, the region 409 including an amorphous semiconductor is a well-ordered semiconductor which has fewer defects and a steep tail of a level at a band edge in the valence band. Since the region 409 including an amorphous semiconductor has a steep tail of a level at a band edge in the valence band, the band gap gets wider and tunneling current does not easily flow. Therefore, by providing the region 409 including an amorphous semiconductor on the back channel side, off current of the thin film transistor can be reduced. In addition, by providing the region 409 including an amorphous semiconductor, on current and field-effect mobility can be increased.

Further, a peak region of a spectrum obtained by performing low-temperature photoluminescence spectroscopy on the region 409 including an amorphous semiconductor is 1.31 eV to 1.39 eV inclusive. Note that a peak region of a spectrum obtained by performing low-temperature photoluminescence spectroscopy on a microcrystalline semiconductor layer such as a microcrystalline silicon layer is 0.98 eV to 1.02 eV inclusive. Accordingly, the region 409 including an amorphous semiconductor is different from a microcrystalline semiconductor layer.

Note that an amorphous semiconductor included in the region 409 including an amorphous semiconductor is amorphous silicon, for example.

Note that nitrogen included in the mixed region 408 and the region 409 including an amorphous semiconductor preferably exists as an NH group or an $NH_2$ group, for example. This is because dangling bonds of a semiconductor atom are cross-linked with a nitrogen atom or an NH group or terminated with an $NH_2$ group, and thus carriers flow easily.

Figure 3:
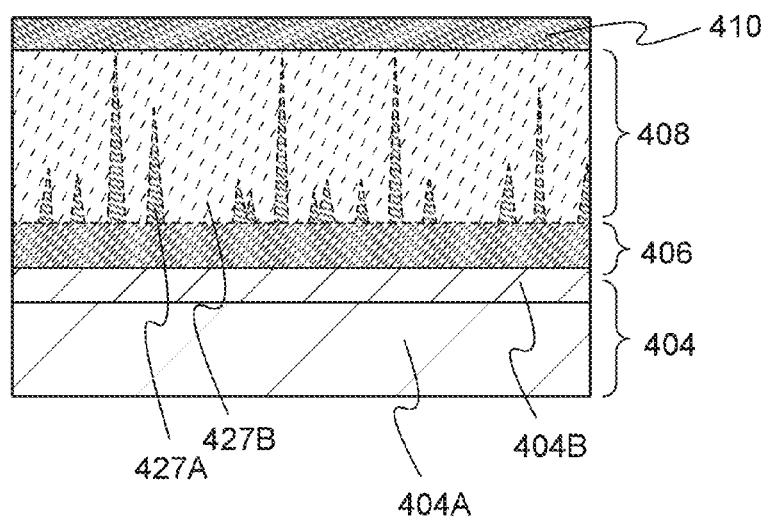
FIG. 3 illustrates a semiconductor layer included in a thin film transistor.

Alternatively, as illustrated in FIG. 3, the mixed region 408 may entirely fill a space between the first semiconductor layer 406 and the source and drain regions 410. It is preferable that the structure illustrated in FIG. 3 have the proportion of the microcrystalline semiconductor region 427A in the mixed region 408 illustrated in FIG. 3 lower than that illustrated in FIGS. 2A and 2B. Further, the proportion of the microcrystalline semiconductor region 427A in the mixed region 408 is preferably low in a region between the source and drain regions, that is, a region where carriers flow. As a result, off current of the thin film transistor can be reduced. In addition, in the mixed region 408, it is possible to reduce resistance in a vertical direction (a thickness direction), that is, resistance between the semiconductor layer and the source and drain regions, when the thin film transistor is in an on state and voltage is applied between the source and drain electrode layers 412, and thus on current and field-effect mobility of the thin film transistor can be increased.

Note that the mixed region 408 illustrated in FIG. 3 may include the microcrystalline semiconductor region 427C as illustrated in FIG. 2B.

Figure 4A:
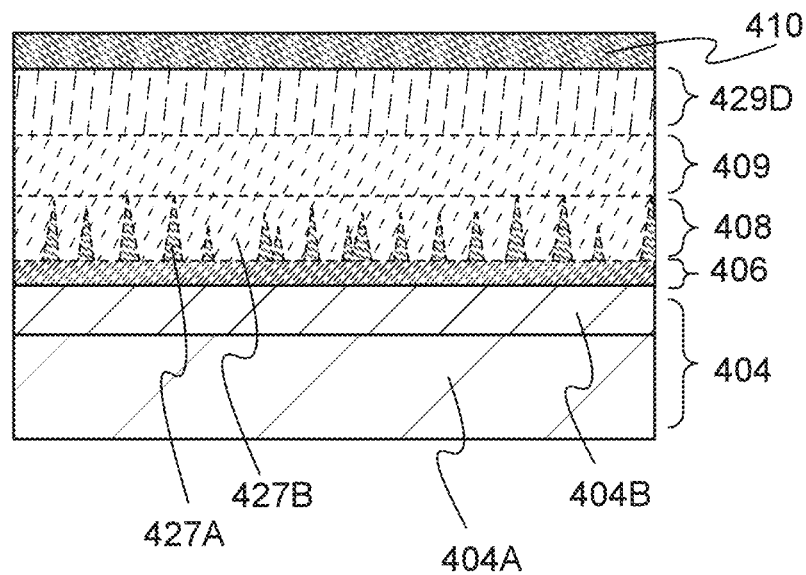
FIGS. 4A and 4B each illustrate a semiconductor layer included in a thin film transistor.
Figure 4B:
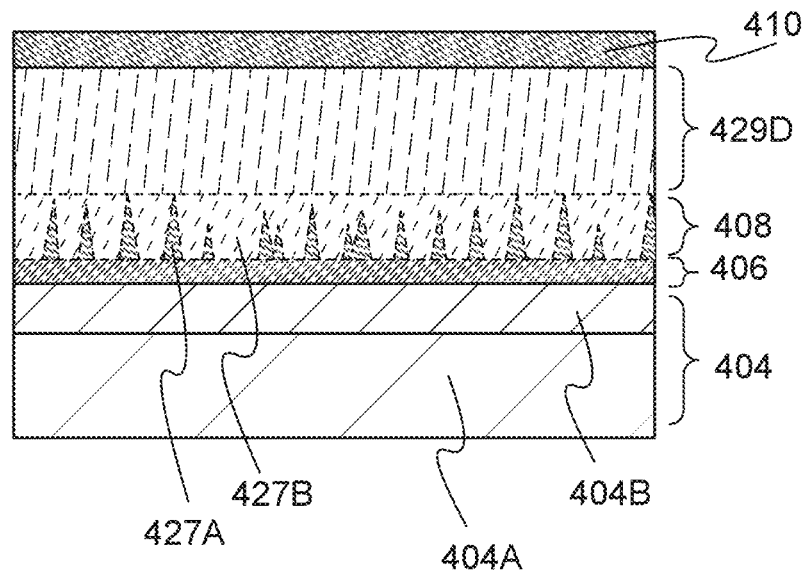

Further, a conventional amorphous semiconductor layer 429D may be provided between the region 409 including an amorphous semiconductor and the source and drain regions 410 as illustrated in FIG. 4A. Alternatively, the conventional amorphous semiconductor layer 429D may be provided between the mixed region 408 and the source and drain regions 410 as illustrated in FIG. 4B. The structures illustrated in FIGS. 4A and 4B enable off current of the thin film transistor to be reduced.

Note that the mixed region 408 illustrated in FIGS. 4A and 4B may include the microcrystalline semiconductor region 427C as illustrated in FIG. 2B.

Since the mixed region 408 includes the microcrystalline semiconductor region 427A having a conical or pyramidal shape, it is possible to reduce resistance in a vertical direction (a thickness direction), that is, resistance of the first semiconductor layer 406, the mixed region 408, and the region 409 including an amorphous semiconductor, when the thin film transistor is in an on state and voltage is applied between the source and drain electrodes.

As described above, the second semiconductor layer 407 contains nitrogen (e.g., an NH group or an $NH_2$ group) in some cases. This is because defects are reduced when nitrogen (e.g., an NH group or an $NH_2$ group) is bonded to dangling bonds of silicon atoms at the interface between a plurality of the microcrystalline semiconductor regions included in the microcrystalline semiconductor region 427A, the interface between the microcrystalline semiconductor region 427A and the amorphous semiconductor region 427B, or the interface between the first semiconductor layer 406 and the amorphous semiconductor region 427B. Accordingly, the nitrogen concentration of the second semiconductor layer 407 is set to higher than or equal to $1\times10^{19}$ atoms/cm$^3$ and lower than or equal to $1\times10^{21}$ atoms/cm$^3$, preferably higher than or equal to $1\times10^{20}$ atoms/cm$^3$ and lower than or equal to $1\times10^{21}$ atoms/cm$^3$, and thus the dangling bonds of silicon atoms can be easily cross-linked with an NH group, so that carriers can flow easily. Alternatively, the dangling bonds of the semiconductor atoms at the aforementioned interfaces are terminated with an $NH_2$ group, so that the defect level disappears. As a result, resistance in a vertical direction (a thickness direction) is reduced when the thin film transistor is in an on state and voltage is applied between the source and drain electrodes. That is, field-effect mobility and on current of the thin film transistor are increased.

By making the oxygen concentration of the second semiconductor layer 407 lower than the nitrogen concentration of the second semiconductor layer 407, bonds which interrupt carrier transfer in defects at the interface between the microcrystalline semiconductor region 427A and the amorphous semiconductor region 427B or at the interface between semiconductor crystal grains can be reduced.

In this manner, off current of the thin film transistor can be reduced when a channel formation region is formed using the first semiconductor layer 406 and the region 409 including an amorphous semiconductor is provided between the channel formation region and the source and drain regions 410. In addition, off current can be further reduced while on current and field-effect mobility can be increased when the mixed region 408 and the region 409 including an amorphous semiconductor are provided. This is because the mixed region 408 includes the microcrystalline semiconductor region 427A having a conical or pyramidal shape and the region 409 including an amorphous semiconductor is formed using a well-ordered semiconductor layer which has few defects and a steep tail of a level at a band edge in the valence band.

In order to control the threshold voltage (Vth), an impurity element imparting p-type conductivity may be added to the first semiconductor layer 406 serving as a channel formation region of the thin film transistor at the same time as or after formation of the first semiconductor layer 406. An example of an impurity element imparting p-type conductivity is boron, and a gas containing an impurity element, such as $B_2H_6$ or $BF_3$, may be mixed into silicon hydride at a proportion of 1 ppm to 1000 ppm inclusive, preferably 1 ppm to 100 ppm inclusive, whereby the first semiconductor layer 406 including an impurity element imparting p-type conductivity can be formed. The concentration of boron included in the first semiconductor layer 406 may be preferably set to higher than or equal to $1\times10^{14}$ atoms/cm$^3$ to lower than or equal to $6\times10^{16}$ atoms/cm$^3$, for example.

The thickness of the first semiconductor layer 406 is preferably set to greater than or equal to 2 nm and less than or equal to 60 nm, more preferably greater than or equal to 10 nm and less than or equal to 30 nm. When the thickness of the first semiconductor layer 406 is in the range of from 2 nm to 60 nm, a thin film transistor can be made to operate as a full depletion type thin film transistor. Note that the second semiconductor layer 407 may be formed to have a thickness of greater than or equal to 10 nm and less than or equal to 500 nm. The thicknesses of these layers can be adjusted by a flow rate of silane and formation time, for example.

Note that it is preferable that an impurity element imparting one conductivity type, such as phosphorus or boron, be not included in the second semiconductor layer 407. In the case where the second semiconductor layer 407 includes phosphorus, boron, or the like, the concentration of phosphorus, boron, or the like is preferably adjusted to be lower than a lower detection limit of secondary ion mass spectrometry. This is for the prevention of formation of a PN junction at the interface between the first semiconductor layer 406 and the second semiconductor layer 407 in the case where the first semiconductor layer 406 includes boron and the second semiconductor layer 407 includes phosphorus. Further, this is for the prevention of formation of a PN junction at the interface between the second semiconductor layer 407 and the source and drain regions 410 in the case where the second semiconductor layer 407 includes boron and the source and drain regions 410 include phosphorus. Furthermore, this is for the prevention of generation of a recombination center and leakage current in the case where the second semiconductor layer 407 include both boron and phosphorus.

The second semiconductor layer 407 which does not include an impurity element such as phosphorus or boron is provided between the source and drain regions 410 and the first semiconductor layer 406, so that an impurity element can be prevented from entering the first semiconductor layer 406 to be a channel formation region.

The source and drain regions 410 are provided in order that the second semiconductor layer 407 and the source and drain electrode layers 412 have ohmic contact with each other. The source and drain regions 410 are formed using amorphous silicon to which phosphorus is added, microcrystalline silicon to which phosphorus is added, or the like. Note that, in the case where a p-channel thin film transistor is formed as a thin film transistor, the source and drain regions 410 are formed using microcrystalline silicon to which boron is added, amorphous silicon to which boron is added, or the like. There is no particular limitation on crystallinity of the source and drain regions 410. The source and drain regions 410 may be formed using a crystalline semiconductor or an amorphous semiconductor; however, the source and drain regions 410 are preferably formed using a crystalline semiconductor. This is because on current is increased when the source and drain regions 410 are formed using a crystalline semiconductor. Note that the source and drain regions 410 may be formed to have a thickness of greater than or equal to 2 nm and less than or equal to 60 nm.

A material of the source and drain electrode layers 412 are not particularly limited as long as a conductive material is used. As the conductive material, a metal material such as molybdenum, titanium, chromium, tantalum, tungsten, aluminum, copper, neodymium, or scandium or an alloy material which includes any of these materials as a main component can be used. Alternatively, crystalline silicon to which an impurity element imparting one conductivity type is added may be used. In addition, the source and drain electrode layers 412 may have a single layer structure or a stacked structure including a plurality of layers. For example, a two-layer structure in which a titanium layer or a molybdenum layer is stacked over an aluminum layer or a copper layer or a three-layer structure in which an aluminum layer or a copper layer is sandwiched with titanium layers or molybdenum layers may be used. Alternatively, a titanium nitride layer may be used instead of the titanium layer.

Next, a method for manufacturing a thin film transistor which is one embodiment of the present invention is described.

The thin film transistor which is one embodiment of the present invention includes a crystalline semiconductor. An n-channel thin film transistor including a crystalline semiconductor has higher carrier mobility than a p-channel thin film transistor including a crystalline semiconductor. Further, it is preferable that all thin film transistors formed over one substrate have the same polarity because the number of manufacturing steps can be reduced. Therefore, a method for manufacturing an n-channel thin film transistor is described here. However, this embodiment is not limited to this.

The gate electrode layer 402 is formed over the gate substrate 400. Then, the silicon nitride layer 404A which covers the gate electrode layer 402 is formed (see FIG. 5A).

The gate electrode layer 402 can be formed in such a manner that a conductive layer is formed over the substrate 400 by a sputtering method or a vacuum evaporation method; a resist mask is formed over the conductive layer by a photolithography method, an inkjet method, or the like; and then the conductive layer is etched using the resist mask. Alternatively, the gate electrode layer 402 can be formed by discharging a conductive nanopaste of silver, gold, copper, or the like over the substrate by an inkjet method, and baking the conductive nanopaste. Note that as a barrier metal for increasing adhesion between the gate electrode layer 402 and the substrate 400 and preventing diffusion of the material used for the gate electrode layer 402 to a base, a nitride layer of any of the above-described metal materials may be provided between the substrate 400 and the gate electrode layer 402. Here, a conductive layer is formed over the substrate 400 and etched using a resist mask formed using a photomask, so that the gate electrode layer 402 is formed.

The gate electrode layer 402 is preferably processed to be tapered. This is because a semiconductor layer and a source wiring (a signal line) are to be formed over the gate electrode layer 402 in a later step. In addition, in this step, a gate wiring (a scan line) can be formed at the same time. Note that a scan line refers to a wiring which selects a pixel.

Note that, in a process for manufacturing a thin film transistor described below, a resist may be applied to an entire surface of a substrate in a photolithography method. Alternatively, a resist is formed by a printing method over a region in which a resist mask is to be formed and then the resist is exposed to light, whereby a resist can be saved and cost can be reduced. Further alternatively, instead of exposing a resist to light by using a light-exposure machine, a laser beam direct drawing apparatus may be used to expose a resist to light.

The silicon nitride layer 404A is formed by a CVD method, a sputtering method, or the like. In the process for forming the silicon nitride layer 404A by a CVD method, glow discharge plasma is generated by supplying electrodes with high-frequency power with a frequency of 3 MHz to 30 MHz, typically 13.56 MHz or 27.12 MHz, or high-frequency power in the VHF band with a frequency of 30 MHz to approximately 300 MHz, typically 60 MHz. Alternatively, high-frequency power with a microwave frequency of 1 GHz or more may be used. With the use of high-frequency power in the VHF band or at a microwave frequency, the deposition rate can be increased. Note that the high-frequency power may be supplied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased. When the silicon nitride layer 404A is formed using a microwave plasma CVD apparatus with a frequency of greater than or equal to 1 GHz, withstand voltage between the gate electrode layer 402 and the source and drain electrode layers 412 can be improved, whereby a highly reliable thin film transistor can be obtained. Although the temperature when the silicon nitride layer 404A is deposited can be set in the range from room temperature to approximately 300° C., the temperature is preferably set to greater than or equal to 260° C. and less than or equal to 300° C. to improve reliability of electric characteristics of the thin film transistor.

Figure 5A:
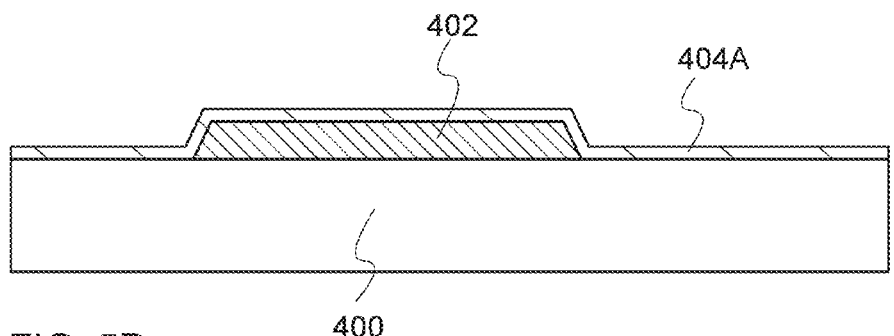
FIGS. 5A to 5D illustrate a method for manufacturing a thin film transistor.
Figure 5B:
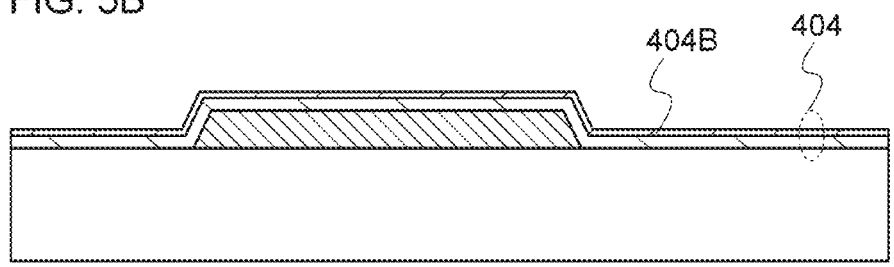

Then, the silicon oxide layer 404B is formed on the silicon nitride layer 404A (see FIG. 5B). The gate insulating layer 404 can be formed by stacking the silicon nitride layer 404A and the silicon oxide layer 404B. The silicon oxide layer 404B may have a thickness which enables the silicon oxide layer 404B to retain a film shape to cover the surface of the silicon nitride layer 404A and which does not reduce throughput extremely due to increase in time for etching the gate insulating layer 404 which is performed to expose the gate electrode layer 402 to be described later (that is, a thickness with which the time for etching the silicon oxide layer 404B is approximately the same as that for etching the silicon nitride layer 404A). The thickness of the silicon oxide layer 404B is preferably greater than or equal to 2 nm and less than 10 nm.

When the surface of the silicon nitride layer 404A is oxidized, a weak bond between silicon and nitrogen is cut, nitrogen is substituted by oxygen, and then oxygen is bonded to silicon. Alternatively, oxygen is bonded to dangling bonds in the silicon nitride layer. The silicon oxide layer 404B can be formed on the surface of the silicon nitride layer 404A through these reactions. In this embodiment, the surface of the silicon oxide layer 404B is exposed to air, so that the surface of the silicon nitride layer 404A can be oxidized. For example, the silicon nitride layer 404A which is formed over the substrate 400 may be exposed to air in a pretreatment chamber. Time for which the silicon nitride layer 404A is exposed to air may be set to time for which the surface of the silicon nitride layer 404A can be oxidized. For example, the time is preferably set to 1 minute to 24 hours. The longer the surface of the silicon nitride layer 404A is exposed to air, the more crystallinity of the first semiconductor layer 406 is increased. Note that the silicon oxide layer 404B can be dense when the substrate 400 is heated while the silicon nitride layer 404A is exposed to air to oxidize the surface of the silicon nitride layer 404A.

Figure 5C:
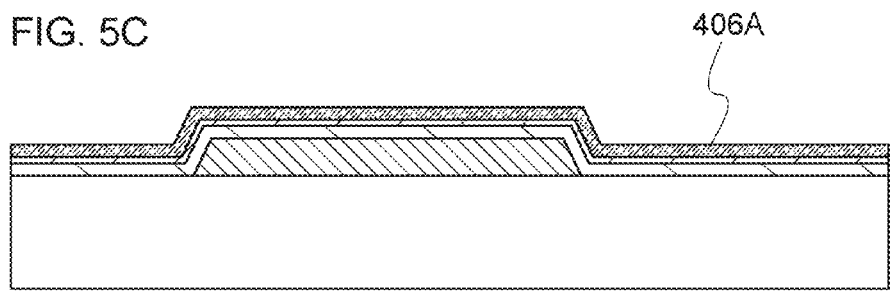

Next, the first semiconductor layer 406A is formed on the silicon oxide layer 404B (see FIG. 5C). In this embodiment, the first semiconductor layer 406A is formed using a microcrystalline semiconductor. In a treatment chamber of a plasma treatment apparatus, a deposition gas containing silicon or germanium is mixed with hydrogen, glow discharge plasma is generated, and thus the microcrystalline semiconductor layer is formed. Alternatively, the microcrystalline semiconductor layer is formed by generating glow discharge plasma with a mixture of a deposition gas containing silicon or germanium, hydrogen, and a rare gas such as helium, neon, or krypton. Microcrystalline silicon, microcrystalline silicon germanium, microcrystalline germanium, or the like is formed using a mixed gas which is obtained by diluting the deposition gas containing silicon or germanium with hydrogen whose flow rate is 10 to 2000 times, preferably 10 to 200 times that of the deposition gas. The deposition temperature at this time is higher than or equal to room temperature and lower than or equal to 300° C., preferably higher than or equal to 200° C. and lower than or equal to 280° C.

Since the outermost surface of the gate insulating layer 404 is the silicon oxide layer 404B, crystal growth of the first semiconductor layer 406A is promoted from the surface of the gate insulating layer 404. As a result, a microcrystalline semiconductor layer with high crystallinity can be formed from the surface of the gate insulating layer 404 and thus on current and field-effect mobility of the thin film transistor can be increased. Further, when the silicon oxide layer 404B is made thin, time for etching the gate insulating layer which is performed to expose the gate electrode layer 402 is not made long, whereby throughput can be improved.

The thickness of the first semiconductor layer 406A is preferably greater than or equal to 3 nm and less than or equal to 100 nm, more preferably greater than or equal to 5 nm and less than or equal to 50 nm. In the case where the first semiconductor layer 406A is too thin, on current of the thin film transistor is reduced. In the case where the first semiconductor layer 406A is too thick, off current is increased when the thin film transistor operates at high temperature. Therefore, the thickness of the first semiconductor layer 406A is set to greater than or equal to 3 nm and less than or equal to 100 nm, preferably greater than or equal to 5 nm to less than or equal to 50 nm, so that on current and off current of the thin film transistor can be adjusted.

The glow discharge plasma used for forming the first semiconductor layer 406A can be generated in the same manner as that used for forming the silicon nitride layer 404A of the gate insulating layer 404.

As a typical example of the deposition gas containing silicon or germanium, silane ($SiH_4$), disilane ($Si_2H_6$), germane ($GeH_4$), digermane ($Ge_2H_6$), or the like can be given.

A rare gas such as helium, argon, neon, krypton, or xenon is mixed into a source gas of the first semiconductor layer 406A, whereby the deposition rate of the first semiconductor layer 406A is increased. When the deposition rate is increased, the amount of impurities mixed into the first semiconductor layer 406A can be reduced, whereby the crystallinity of the first semiconductor layer 406A can be improved. Accordingly, on current and field-effect mobility of the thin film transistor can be increased and throughput can also be increased.

Note that the first semiconductor layer 406A may be formed under two or more different conditions. For example, after one part of the first semiconductor layer 406A is formed under a first condition, the other part of the first semiconductor layer 406A may be formed under a condition where a dilution ratio is lower than that used in the first condition. Alternatively, after one part of the first semiconductor layer 406A is formed under a first condition, the other part of the first semiconductor layer 406A may be formed under a condition where a dilution ratio is higher than that used in the first condition.

Note that before the first semiconductor layer 406A is formed, impurities in the treatment chamber of the CVD apparatus are removed by introducing the deposition gas containing silicon or germanium while exhausting a gas in the treatment chamber, so that the amount of the impurities in the gate insulating layer 404 and the first semiconductor layer 406A, which is formed later, of the thin film transistor can be reduced, and thus, electric characteristics of the thin film transistor can be improved.

Figure 5D:
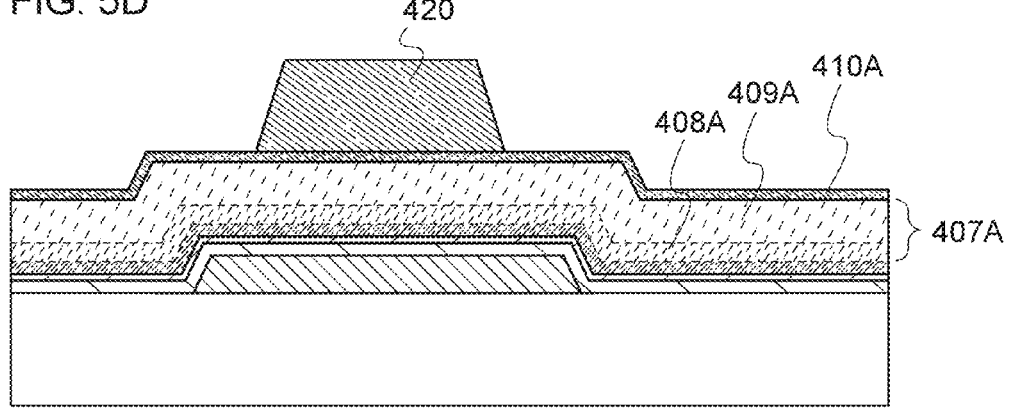

Next, a mixed region 408A and a region 409A including an amorphous semiconductor are stacked over the first semiconductor layer 406A, whereby a second semiconductor layer 407A is formed (see FIG. 5D). Then, an impurity semiconductor layer 410A is formed over the second semiconductor layer 407A and a resist mask 420 is formed over the impurity semiconductor layer 410A.

Since the first semiconductor layer 406A is formed using a microcrystalline semiconductor layer, the second semiconductor layer 407A is formed under a condition that crystals grow partly with the microcrystalline semiconductor used as a seed crystal.

The second semiconductor layer 407A is formed by generating glow discharge plasma with a mixture of a deposition gas containing silicon or germanium, hydrogen, and a gas containing nitrogen in a reaction chamber of a plasma CVD apparatus. Examples of the gas containing nitrogen include ammonia, nitrogen, nitrogen fluoride, nitrogen chloride, chloroamine, fluoroamine, and the like. Glow discharge plasma can be generated in the same manner as that of the silicon nitride layer 404A of the gate insulating layer 404.

In this case, a flow ratio of the deposition gas containing silicon or germanium to hydrogen is the same as that for forming the first semiconductor layer 406A which is a microcrystalline semiconductor layer and a gas containing nitrogen is used as the source gas, whereby crystal growth can be suppressed as compared to the deposition condition of the first semiconductor layer 406A. Accordingly, the mixed region 408A and the region 409A including an amorphous semiconductor can be formed. Note that the region 409A including an amorphous semiconductor is a well-ordered semiconductor layer which has few defects and a steep tail of a level at a band edge in the valence band.

Here, an example of a condition for forming the second semiconductor layer 407A is as follows: the flow rate of hydrogen is 10 to 2000 times, preferably 10 to 200 times that of the deposition gas containing silicon or germanium. Note that in an example of a normal condition for forming an amorphous semiconductor layer, the flow rate of hydrogen is 0 to 5 times that of the deposition gas containing silicon or germanium.

A rare gas such as helium, neon, argon, xenon, or krypton is mixed into a source gas of the second semiconductor layer 407A, whereby the deposition rate of the second semiconductor layer 407A can be increased.

The thickness of the second semiconductor layer 407A is preferably greater than or equal to 50 nm and less than or equal to 350 nm, more preferably greater than or equal to 120 nm and less than or equal to 250 nm.

At an early stage of deposition of the second semiconductor layer 407A, since a gas containing nitrogen is included in the source gas, the crystal growth is partly suppressed; therefore, while a conical or pyramidal microcrystalline semiconductor region grows, an amorphous semiconductor region is formed which fills a space between the conical or pyramidal microcrystalline semiconductor regions. Such a region where the microcrystalline semiconductor region and the amorphous semiconductor region are mixed is the mixed region 408A. Then, the crystal growth of the conical or pyramidal microcrystalline semiconductor region stops and only an amorphous semiconductor region which does not include a microcrystalline semiconductor region is formed. Such a region where only the amorphous semiconductor region which does not include a microcrystalline semiconductor region is formed is the region 409A including an amorphous semiconductor. Such conditions correspond to the "conditions that a crystal grows partly". Before the conical or pyramidal microcrystalline semiconductor region grows, a microcrystalline semiconductor layer may be deposited on the entire surface of the first semiconductor layer 406 with the first semiconductor layer 406 used as a seed crystal.

Here, the second semiconductor layer 407A is formed using a mixture of the source gas of the second semiconductor layer 407A and a gas containing nitrogen. Alternatively, the second semiconductor layer 407A including the mixed region 408A and the region 409A including an amorphous semiconductor can be formed in a manner in which the surface of the first semiconductor layer 406A is exposed to a gas containing nitrogen, nitrogen is adsorbed onto the surface of the first semiconductor layer 406A, and glow discharge is performed using a deposition gas containing silicon or germanium and hydrogen as source gases.

Since the impurity semiconductor layer 410A serves as the source and drain regions 410 illustrated in FIGS. 1A and 1B, the materials described as the materials of the source and drain regions 410 can be used as appropriate. The impurity semiconductor layer 410A can be formed using a source gas introduced into the treatment chamber of the plasma CVD apparatus, to which an impurity element imparting one conductivity type is added. In the case where an n-channel thin film transistor is formed, for example, phosphorus may be added as the impurity element and a gas containing an impurity element imparting n-type conductivity, such as phosphine (chemical formula: $PH_3$), may be added to silicon hydride. In the case where a p-channel thin film transistor is formed, for example, boron may be added as the impurity element and a gas containing an impurity element imparting p-type conductivity, such as diborane (chemical formula: $B_2H_6$), may be added to silicon hydride.

Now, a formation process from the first semiconductor layer 406A up to the impurity semiconductor layer 410A is described with reference to a schematic view of a plasma CVD apparatus (see FIG. 7) and a time chart.

Figure 7:
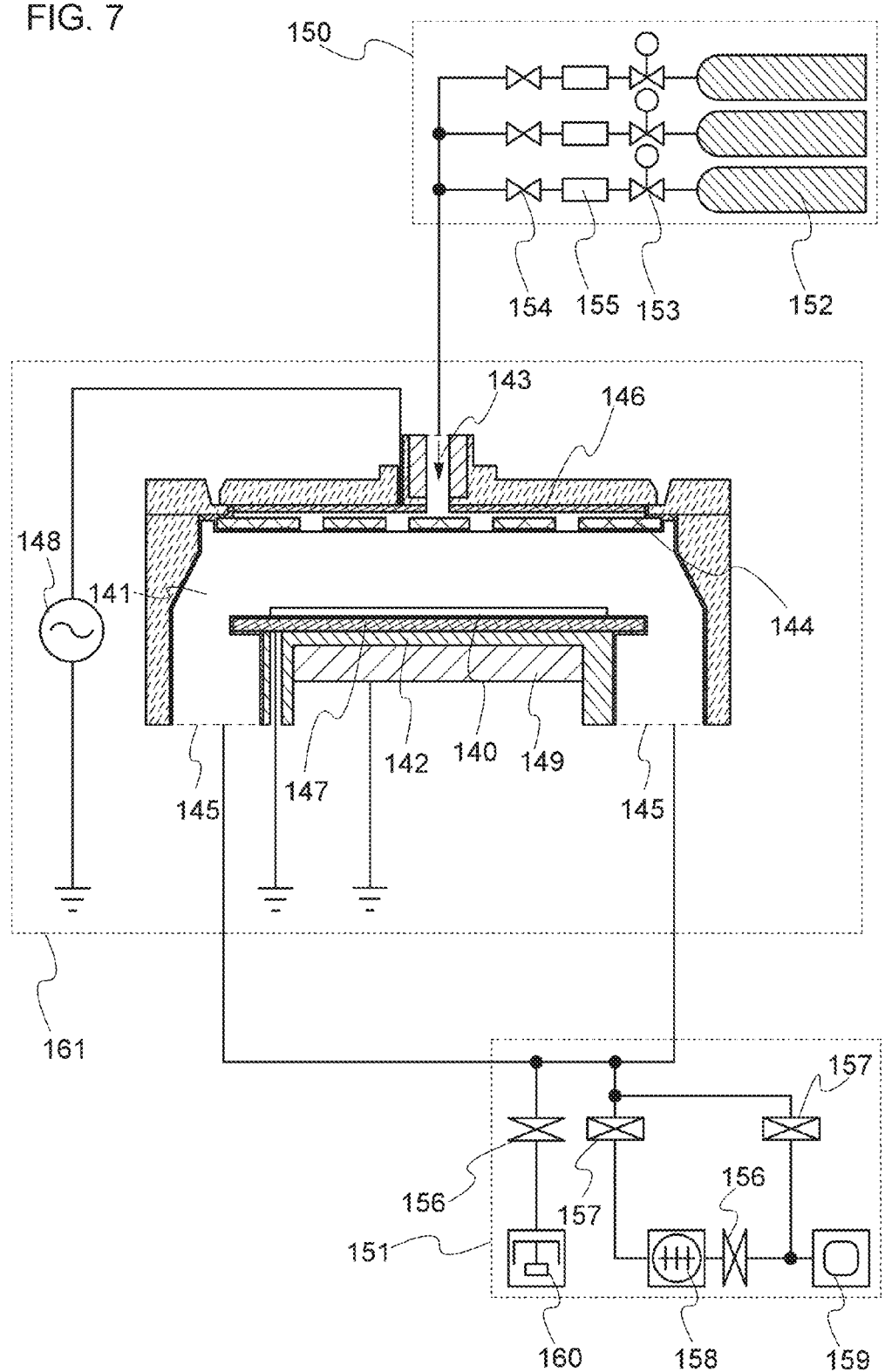
FIG. 7 illustrates an example of a plasma treatment apparatus.

A plasma CVD apparatus 161 illustrated in FIG. 7 is connected to a gas supply unit 150 and an exhaust unit 151 and includes a treatment chamber 141, a stage 142, a gas supply portion 143, a shower plate 144, an exhaust port 145, an upper electrode 146, a lower electrode 147, an alternate-current power source 148, and a temperature controller 149. A substrate 140 over which a film is to be formed is placed over the lower electrode 147.

The treatment chamber 141 is formed using a material having rigidity and the inside thereof can be evacuated to vacuum. The treatment chamber 141 is provided with the upper electrode 146 and the lower electrode 147. Note that in FIG. 7, a structure of a capacitive coupling type (a parallel plate type) is illustrated; however, another structure such as a structure of an inductive coupling type can be used, as long as plasma can be generated in the treatment chamber 141 by supplying two or more kinds of high-frequency powers.

When treatment is performed with the plasma CVD apparatus illustrated in FIG. 7, a given gas is introduced from the gas supply portion 143. The introduced gas is introduced into the treatment chamber 141 through the shower plate 144. When high-frequency power is supplied by the alternate-current power source 148 connected to the upper electrode 146 and the lower electrode 147 to excite the gas in the treatment chamber 141, plasma is generated. Then, the gas in the treatment chamber 141 is exhausted through the exhaust port 145 connected to a vacuum pump. Further, the temperature controller 149 makes it possible to perform plasma treatment while an object to be processed is being heated.

The gas supply unit 150 includes a cylinder 152 which is filled with a gas, a pressure adjusting valve 153, a stop valve 154, a mass flow controller 155, and the like. The treatment chamber 141 includes the shower plate 144 between the upper electrode 146 and the substrate 140. The shower plate 144 is processed into a plate-like shape and provided with a plurality of pores. The gas introduced into the upper electrode 146 is introduced into the treatment chamber 141 from these pores of the shower plate 144 through an inner hollow structure.

The exhaust unit 151 connected to the treatment chamber 141 has a function of vacuum evacuation and a function of controlling the pressure inside the treatment chamber 141 to be maintained at a predetermined level when a reaction gas is made to flow. The exhaust unit 151 includes a valve 156, a conductance valve 157, a turbo molecular pump 158, a dry pump 159, and the like. Although not illustrated, in the case of arranging the valve 156 and the conductance valve 157 in parallel, the valve 156 is closed and the conductance valve 157 is operated, so that the exhaust velocity is controlled and thus the pressure in the treatment chamber 141 can be kept within a predetermined range. Note that when the valve 156 having higher conductance is opened, the pressure in the treatment chamber 141 can be controlled to be maintained at a predetermined level.

In the case where the treatment chamber 141 is evacuated to pressure lower than $10^{-5}$ Pa, a cryopump 160 is preferably used together. Alternatively, when exhaust is performed up to ultra-high vacuum as ultimate degree of vacuum, the inner wall of the treatment chamber 141 may be polished into a mirror surface and a heater for baking may be provided in order to reduce gas emission from the inner wall.

Note that as illustrated in FIG. 7, when pre-coating treatment is performed so that a film is formed (deposited) so as to cover the entire inner wall of the treatment chamber 141, it is possible to prevent impurities attached to the inner wall of the treatment chamber 141 or impurities forming the inner wall of the treatment chamber 141 from entering an element.

Note that for plasma to be generated, for example, RF (3 MHz to 30 MHz, for example, 13.56 MHz or 27 MHz) plasma, VHF (30 MHz to 300 MHz, for example, 60 MHz) plasma, or microwave (1 GHz or higher, for example, 2.45 GHz) plasma can be used. Note that plasma is preferably generated in a pulsed manner.

In addition, a pretreatment chamber may be connected to the apparatus. When a substrate is preheated in the pretreatment chamber before film formation, heating time required before the film formation in each treatment chamber can be shortened, whereby throughput can be increased.

Note that the use of a multi-chamber plasma CVD apparatus as the plasma CVD apparatus allows a layer of one kind or layers with similar kinds of compositions to be formed in each chamber. Therefore, stacked films can be formed without interfaces being contaminated by a residue of formed layers or an impurity floating in the air.

Note that the inside of the treatment chamber 141 of the plasma CVD apparatus is preferably cleaned with fluorine radicals. Note also that a protection film is preferably formed in the treatment chamber 141 before film formation.

Figure 8:
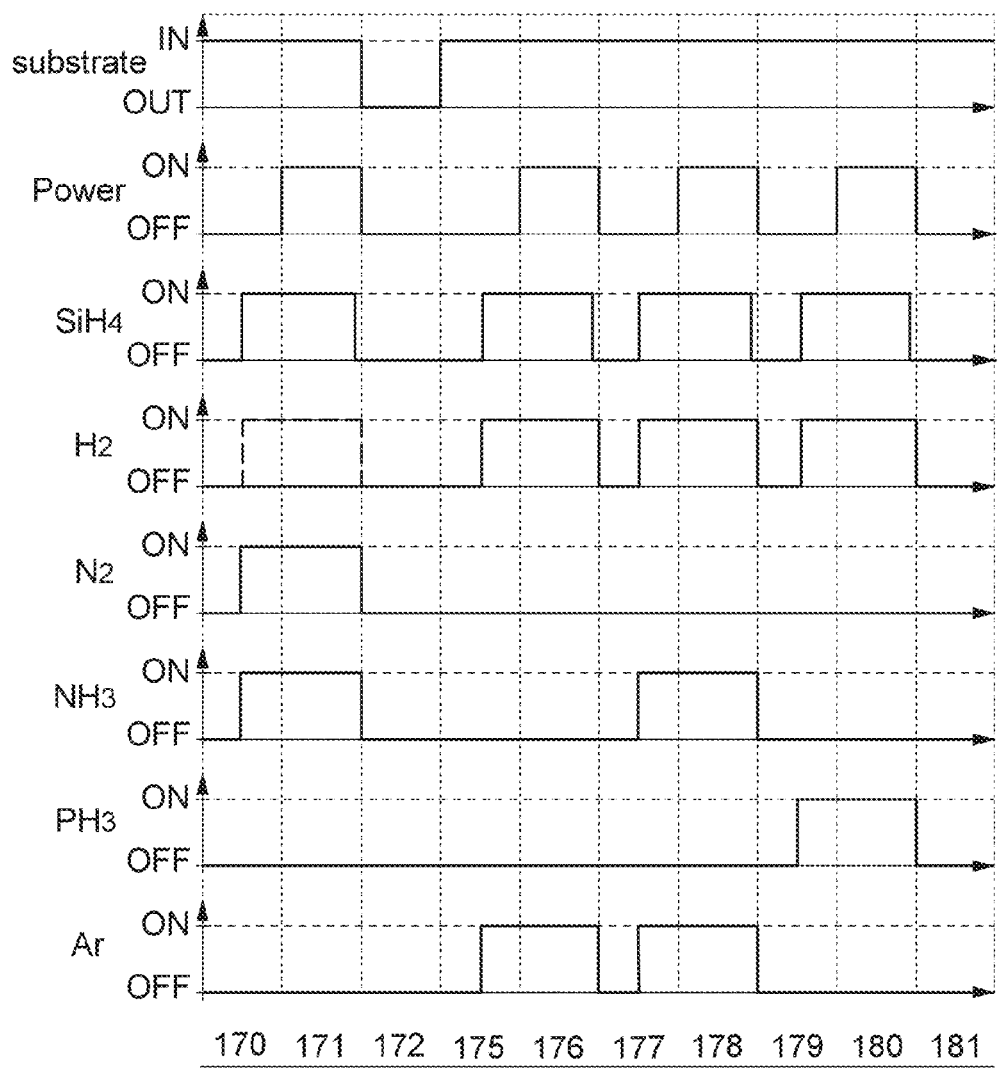
FIG. 8 illustrates an example of a timing chart of a method for manufacturing a thin film transistor.

FIG. 8 is a time chart showing steps of forming the silicon nitride layer 404A up to the impurity semiconductor layer 410A.

First, the substrate 400 over which the gate electrode layer 402 is formed is heated in the treatment chamber 141 of the plasma CVD apparatus and source gases used for forming the silicon nitride layer 404A are introduced into the treatment chamber 141 (pretreatment 170 in FIG. 8). Here, as an example, a SiH$_4$ gas, an H$_2$ gas, an N$_2$ gas, and an NH$_3$ gas are introduced as source gases at flow rates of 40 sccm, 500 sccm, 550 sccm, and 140 sccm, respectively, and are stabilized. In addition, the pressure in the treatment chamber 141 is set to 100 Pa; the substrate temperature is set to 280° C.; and plasma discharge is performed using the RF power source frequency of 13.56 MHz and power of the RF power source of 370 W. Thus, the silicon nitride layer 404A with a thickness of approximately 300 nm is formed. After that, only the introduction of the SiH$_4$ gas is stopped, and after several seconds (five seconds, here), the plasma discharge is stopped (silicon nitride layer formation 171 in FIG. 8). Note that either an N$_2$ gas or an NH$_3$ gas may be used and in the case of mixing the gases to be used, the flow rates of the gases may be adjusted as appropriate. Further, the flow rate of the H$_2$ gas is adjusted as appropriate when the H$_2$ gas is introduced, and the H$_2$ gas is not necessarily introduced.

Next, the substrate is transferred from the treatment chamber 141 to a load lock chamber. The substrate is exposed to an air atmosphere, so that the surface of the silicon nitride layer 404A is oxidized and thus the silicon oxide layer 404B is formed on the silicon nitride layer 404A (substrate transfer 172 in FIG. 8).

Next, source gases used for forming the first semiconductor layer 406A are introduced into the treatment chamber 141 (gas replacement 175 in FIG. 8).

Next, the first semiconductor layer 406A is formed over the entire surface of the silicon oxide layer 404B. First, the source gases used for forming the first semiconductor layer 406A is introduced into the treatment chamber 141. Here, as an example, a SiH$_4$ gas, an H$_2$ gas, and an Ar gas are introduced as source gases at flow rates of 10 sccm, 1500 sccm, and 1500 sccm, respectively, and are stabilized. In addition, the pressure in the treatment chamber 141 is set to 280 Pa; the substrate temperature is set to 280° C.; and plasma discharge is performed using the RF power source frequency of 13.56 MHz and power of the RF power source of 50 W. Thus, a microcrystalline silicon layer to be the first semiconductor layer 406A is formed. After that, in a manner similar to that of the silicon nitride layer 404A or the like, only the introduction of the SiH$_4$ gas is stopped, and after several seconds (five seconds, here), plasma discharge is stopped (silicon layer formation 176 in FIG. 8). After that, these gases are exhausted, and gases used for forming the second semiconductor layer 407A are introduced (gas replacement 177 in FIG. 8). Note that without being limited thereto, replacement of gases is not necessarily performed.

Next, the second semiconductor layer 407A is formed over the entire surface of the first semiconductor layer 406A. First, the source gases used for forming the second semiconductor layer 407A is introduced into the treatment chamber 141. Here, as an example, a SiH$_4$ gas, an H$_2$ gas, and a NH$_3$ gas diluted with an H$_2$ gas to 1000 ppm are introduced as source gases at flow rates of 30 sccm, 1475 sccm, and 25 sccm, respectively, and are stabilized. In addition, the pressure in the treatment chamber 141 is set to 280 Pa; the substrate temperature is set to 280° C.; and plasma discharge is performed using the RF power source frequency of 13.56 MHz and power of the RF power source of 50 W. Thus, a silicon layer to be the second semiconductor layer 407A is formed. After that, in a manner similar to that of the silicon nitride layer 404A or the like, only the introduction of the SiH$_4$ gas is stopped, and after several seconds (five seconds, here), the plasma discharge is stopped (second semiconductor layer formation 178 in FIG. 8). After that, these gases are exhausted, and gases used for forming the impurity semiconductor layer 410A containing an impurity element serving as a donor are introduced (gas replacement 179 in FIG. 8).

Next, the impurity semiconductor layer 410A containing an impurity element serving as a donor is formed over the entire surface of the second semiconductor layer 407A. First, the source gases used for forming the impurity semiconductor layer 410A containing an impurity element serving as a donor are introduced into the treatment chamber 141. Here, as an example, a SiH$_4$ gas and a mixed gas in which a PH$_3$ gas is diluted with an H$_2$ gas to 0.5 vol % are introduced as the source gases at flow rates of 100 sccm and 170 sccm, respectively, and are stabilized. In addition, the pressure in the treatment chamber 141 is set to 170 Pa; the substrate temperature is set to 280° C.; and plasma discharge is performed using the RF power source frequency of 13.56 MHz; and power of the RF power source of 60 W. Thus, the impurity semiconductor layer 410A containing an impurity element serving as a donor is formed. After that, in a manner similar to that of the silicon nitride layer 404A or the like, only the introduction of the SiH$_4$ gas is stopped, and after several seconds (five seconds, here), plasma discharge is stopped (impurity semiconductor layer formation 180 in FIG. 8). After that, these gases are exhausted (exhaust 181 in FIG. 8). When the flow ratio of the SiH$_4$ gas to the H$_2$ gas, which are used for forming the impurity semiconductor layer 410A, is set to substantially the same as that of the first semiconductor layer 406A, the impurity semiconductor layer 410A can be formed of a crystalline semiconductor, which is preferable.

Thus, formation of the silicon nitride layer 404A up to the impurity semiconductor layer 410A can be performed.

The resist mask 420 can be formed by a photolithography method. Alternatively, the resist mask 420 may be formed by an inkjet method or the like.

Figure 6A:
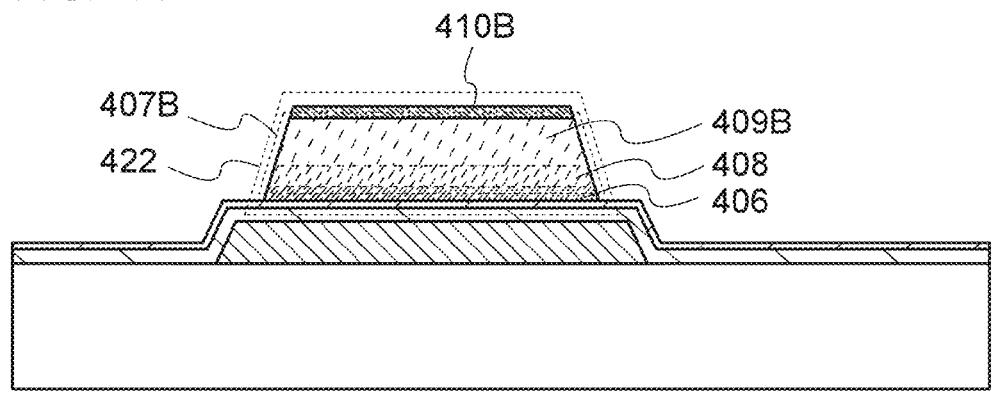
FIGS. 6A to 6C illustrate a method for manufacturing a thin film transistor.

Next, the first semiconductor layer 406A, the second semiconductor layer 407A, and the impurity semiconductor layer 410A are etched using the resist mask 420. By this treatment, the first semiconductor layer 406A, the second semiconductor layer 407A, and the impurity semiconductor layer 410A are separated into elements to form a stacked body 422 which includes the first semiconductor layer 406, a second semiconductor layer 407B formed using the mixed region 408 and a region 409B including an amorphous semiconductor, and an impurity semiconductor layer 410B (see FIG. 6A). Then, the resist mask 420 is removed.

This etching treatment is preferably performed so that the stacked body 422 which includes the first semiconductor layer 406, the second semiconductor layer 407B, and the impurity semiconductor layer 410B can have a tapered shape. The taper angle is from 30° to 90° inclusive, preferably from 40° to 80° inclusive. When the side surface has a tapered shape, coverage with a layer which is formed thereover (e.g., a wiring layer) in a later step can be improved. Accordingly, disconnection or the like caused by a step portion can be prevented.

Figure 6B:
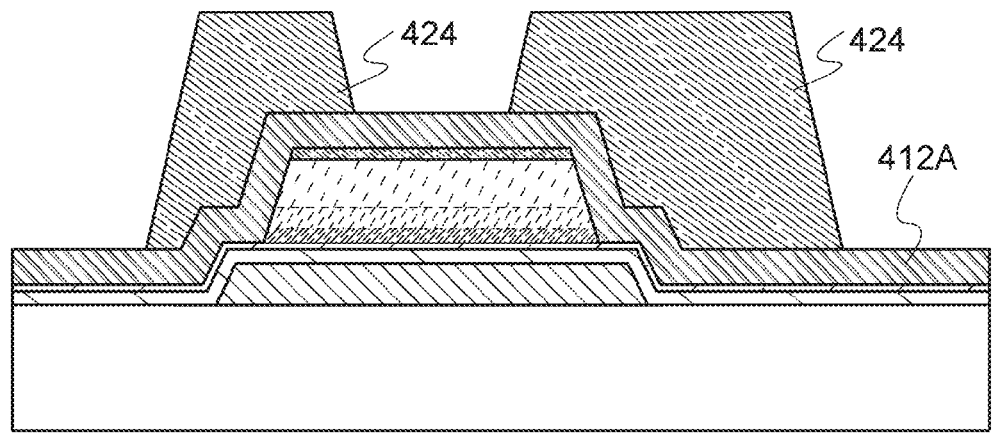

Next, after a conductive layer 412A is formed over the impurity semiconductor layer 410B and the gate insulating layer 404, a resist mask 424 is formed over the conductive layer 412A (see FIG. 6B). The conductive layer 412A is to be patterned into the source and drain electrode layers 412 in a later step.

The conductive layer 412A can be formed using a material similar to that of the source and drain electrode layers 412 illustrated in FIGS. 1A and 1B as appropriate. The conductive layer 412A is formed by a sputtering method, a vacuum evaporation method, or the like. Alternatively, the conductive layer 412A may be formed by discharging a conductive nanopaste of silver, gold, copper, or the like by a screen printing method, an inkjet method, or the like, and baking the conductive nanopaste.

In a manner similar to the resist mask 420, the resist mask 424 is formed by a photolithography method or an inkjet method.

Next, the conductive layer 412A is etched using the resist mask 424 to form the source and drain electrode layers 412. Wet etching is preferably used. By this wet etching, portions of the conductive layer 412A, which are not covered with the resist mask 424, is isotropically etched. The source and drain electrode layers 412 serve not only as source and drain electrodes of the thin film transistor but also as a source wiring (signal line).

Next, the impurity semiconductor layer 410B and the region 409B including an amorphous semiconductor are etched with the resist mask 424 formed thereover, so that the source and drain regions 410 and a back channel portion (a portion illustrated as the back channel portion 432 in FIG. 1B) are formed. Thus, the source and drain regions 410 are formed. Note that the region 409B including an amorphous semiconductor is etched with part thereof left, and thus the region 409 including an amorphous semiconductor is formed.

Here, etching may be performed by dry etching using a gas containing oxygen. The gas containing oxygen can etch the impurity semiconductor layer 410B and the region 409B including an amorphous semiconductor while the resist mask is being recessed, so that the source and drain regions 410 and the region 409 including an amorphous semiconductor can have a tapered shape. As the etching gas, for example, an etching gas in which oxygen is mixed into $CF_4$ or an etching gas in which oxygen is mixed into chlorine may be used. When the source and drain regions 410 and the region 409 including an amorphous semiconductor have a tapered shape, electric field concentration can be prevented and off current can be reduced.

Note that instead of the above steps, each of the conductive layer 412A, the impurity semiconductor layer 410B, and the region 409B including an amorphous semiconductor may be partly dry-etched. At this time, side surfaces of the source and drain electrode layers 412 are substantially aligned with side surfaces of the source and drain regions 410.

Alternatively, the conductive layer 412A may be etched using the resist mask 424 to form the source and drain electrode layers 412. Then, after the resist mask 424 is removed, the impurity semiconductor layer 410B and the region 409B including an amorphous semiconductor may be partly etched. Since the impurity semiconductor layer 410B is etched using the source and drain electrode layers 412 in this etching, side surfaces of the source and drain electrode layers 412 are substantially aligned with side surfaces of the source and drain regions 410.

The region 409B including an amorphous semiconductor is partly etched, so that the region 409 including an amorphous semiconductor has a depressed portion. It is preferable that the thickness of the region 409 including an amorphous semiconductor be set so that the mixed region 408 is not exposed and at least part of the region 409 including an amorphous semiconductor overlapping with the depressed portion is left.

Figure 6C:
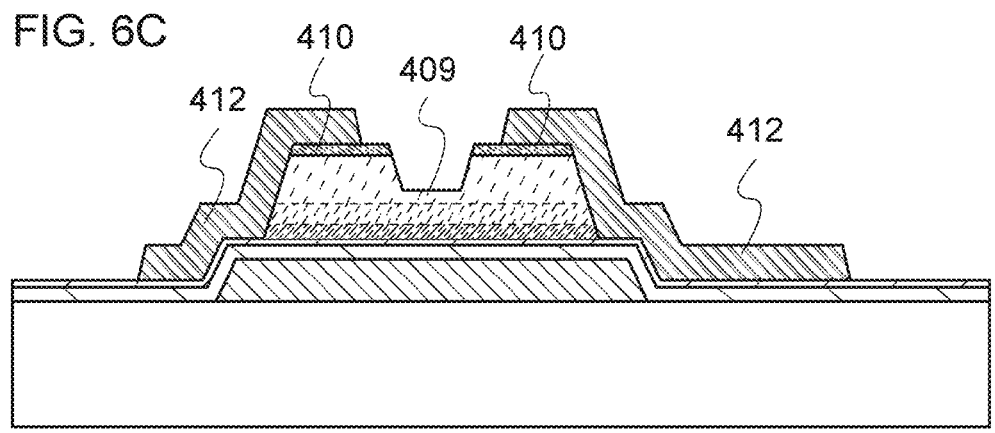

After that, the resist mask 424 is removed (see FIG. 6C).

When residual products generated in the etching process, residues of the resist mask, a remover solution, and the like are attached to or deposited over a surface of the region 409 including an amorphous semiconductor which lies between the source and drain regions, off current of the thin film transistor is increased. Therefore, for the purpose of removing them, dry etching may be performed under a condition which causes less damage, preferably without bias. Alternatively, plasma treatment may be performed on a portion illustrated as the back channel portion 432 in FIG. 1B. Further alternatively, cleaning may be performed. Furthermore, these steps may be combined.

Through the above steps, a channel-etched thin film transistor can be manufactured.

After that, a connection terminal which is connected to the gate electrode layer 402 can be formed by etching part of the gate insulating layer 404 to expose the gate electrode layer 402.

After the thin film transistor is manufactured through the above steps, an insulating layer is formed over the thin film transistor, part of the insulating layer is etched to expose the source and drain electrode layers 412 and the gate electrode layer 402, and a connection wiring which connects the source and drain electrode layers 412 to the gate electrode layer 402 may be formed.

In these steps, the thickness of the silicon oxide layer 404B is preferably greater than or equal to 2 nm and less than 10 nm, for example, which does not reduce throughput extremely due to increase in the time for etching the gate insulating layer 404 (that is, a thickness with which the time for etching the silicon oxide layer 404B is approximately the same as that for etching the silicon nitride layer 404A) which is performed to expose the gate electrode layer 402.

Through these steps, throughput in the steps for manufacturing the thin film transistor and the element substrate or the display device including the thin film transistor can be improved, and the thin film transistor with small off current, large on current, and high field-effect mobility can be manufactured. Further, such a thin film transistor can be manufactured with high productivity.

Embodiment 2

The oxidation treatment for forming the silicon oxide layer 404B is not limited to the oxidation treatment described in Embodiment 1. In this embodiment, one embodiment of oxidation treatment is described in which plasma is generated in an atmosphere containing oxygen and a surface to be oxidized is exposed to the plasma.

First, similarly to Embodiment 1, the gate electrode layer 402 and the silicon nitride layer 404A are formed over the substrate 400 (see FIG. 5A). Then, plasma is generated in an atmosphere containing oxygen and the silicon nitride layer 404A is exposed to the plasma. Accordingly, the surface of the silicon nitride layer 404A is oxidized to form the silicon oxide layer 404B.

Here, the atmosphere which is used for generating plasma may contain at least oxygen atoms. As an example of the atmosphere which is used for generating plasma, the following can be given: an oxygen atmosphere, an atmosphere containing nitrogen oxide (e.g., nitrogen monoxide, nitrogen dioxide, dinitrogen monoxide, dinitrogen trioxide, dinitrogen tetroxide, or dinitrogen pentoxide), and an atmosphere containing sulfur oxide (e.g., sulfur monoxide, sulfur dioxide, or sulfur trioxide). Alternatively, a mixed gas atmosphere in which a rare gas (e.g., argon, neon, or xenon), nitrogen, or the like is added to any of the above atmospheres may be used. For example, an air atmosphere may be used. It is preferable that a large amount of an oxygen gas or a gas containing oxygen be included in the atmosphere.

Alternatively, water plasma may be used. Water plasma can be generated in such a manner that a gas containing water as its main component such as water vapor is introduced into a treatment chamber. Note that water plasma may be generated by introducing water vapor or the like into the above atmosphere which is used for generating plasma.

As an apparatus which is used for generating plasma, for example, a plasma CVD apparatus can be given. Here, the plasma CVD apparatus which is used for forming the silicon nitride layer 404A is preferably used for this plasma treatment; in this way, the same apparatus can be used.

Note that when an apparatus which can generate surface wave plasma is employed as the apparatus for generating plasma, plasma treatment can be performed without damages on the surface to be oxidized. Therefore, when the surface to be oxidized is the silicon nitride layer which is part of the gate insulating layer as in the case of Embodiment 1, damages on the silicon nitride layer can be reduced by performing plasma treatment with the use of surface wave plasma.

As described in this embodiment, a silicon oxide layer can be formed on a silicon nitride layer with the use of plasma including oxygen for oxidation treatment.

Embodiment 3

The oxidation treatment for forming the silicon oxide layer 404B is not limited to the oxidation treatments described in Embodiments 1 and 2. In this embodiment, one embodiment of the oxidation treatment is described.

First, similarly to Embodiment 1, the gate electrode layer 402 and the silicon nitride layer 404A are formed over the substrate 400 (see FIG. 5A). Then, ozone is generated in a treatment chamber and the silicon nitride layer 404A is exposed to the ozone, so that the surface of the silicon nitride layer 404A is oxidized to form the silicon oxide layer 404B. Note that the substrate may be transferred into the treatment chamber after ozone is generated in the treatment chamber. Alternatively, the substrate may be transferred into the treatment chamber before ozone is generated.

Note that ozone means an isotope of oxygen, which consists of three oxygen atoms.

Here, a method for generating ozone is not particularly limited and various methods can be used. For example, ozone can be generated by irradiation of an oxygen gas (or a gas containing oxygen) with ultraviolet light or by electric discharge in an oxygen gas (or a gas containing oxygen). In the case of using ultraviolet light, ultraviolet light having a short wavelength is preferably generated. For example, with the use of a mercury-vapor lamp, ultraviolet light having a wavelength of 253.7 nm and a wavelength of 365.0 nm can be generated. Note that in the case of electric discharge, an oxygen gas (or a gas containing oxygen) is introduced between two electrode plates (electrode plates covered with a dielectric), high AC voltage is applied to cause silent electric discharge, oxygen molecules between the electrode plates are dissociated, and the oxygen atoms are recombined with other oxygen molecule; thus, ozone can be generated.

Alternatively, ozone may be generated by electrolysis of dilute sulfuric acid or water, for example.

Further alternatively, air may be used instead of the above oxygen gas (or a gas containing oxygen). That is, ozone may be generated by irradiation of an air atmosphere with ultraviolet light or by electric discharge in an air atmosphere.

As described in this embodiment, a silicon oxide layer can be formed on a silicon nitride layer with the use of ozone for oxidation treatment.

Embodiment 4

The oxidation treatment for forming the silicon oxide layer 404B is not limited to the oxidation treatments described in Embodiments 1 to 3. In this embodiment, one embodiment of the oxidation treatment is described.

First, similarly to Embodiment 1, the gate electrode layer 402 and the silicon nitride layer 404A are formed over the substrate 400 (see FIG. 5A). Then, the substrate 400 is carried out of the treatment chamber, the silicon nitride layer 404A is exposed to ozone water to oxidize the surface of the silicon nitride layer 404A; thus, the silicon oxide layer 404B can be formed.

Note that ozone water is a solution of ozone, which is obtained by dissolving ozone in water. The ozone water can be formed by bubbling, for example. Note that ozone can be generated by the method described in Embodiment 3.

Note that the concentration of the ozone water used here is not particularly limited. The ozone water may have such a concentration that the silicon nitride layer 404A is oxidized. It is preferable that the ozone water having a concentration of 1 ppm or more and 20 ppm or less, more preferably, 5 ppm or more and 15 ppm or less, be used.

As described in this embodiment, a silicon oxide layer can be formed on a silicon nitride layer with the use of ozone water for oxidation treatment.

Embodiment 5

A silicon oxide layer may be formed over a silicon nitride layer using another method instead of the oxidation treatment described in Embodiment 1. In this embodiment, one mode of the method is described.

First, similarly to Embodiment 1, the gate electrode layer 402 and the silicon nitride layer 404A are formed over the substrate 400 (see FIG. 5A). Then, the silicon oxide layer 404B is formed over the silicon nitride layer 404A. The silicon oxide layer 404B preferably has a thickness which enables the silicon oxide layer 404B to retain a film shape and which does not reduce throughput extremely in forming a contact hole. Therefore, the thickness of the silicon oxide layer is preferably greater than or equal to 2 nm and less than or equal to 10 nm.

Here, similarly to the silicon nitride layer 404A, the silicon oxide layer 404B can be formed by a CVD method, preferably by a plasma CVD method, for example.

Note that the silicon oxide layer 404B can be formed using tetraethoxysilane (TEOS (chemical formula: $Si(OC_2H_5)_4$)) as a source gas, for example. An atmospheric pressure CVD method or the like can be used as a formation method.

Note that a silicon oxynitride layer may be used instead of the silicon oxide layer 404B formed over the silicon nitride layer 404A. For example, the silicon oxynitride layer can be formed as follows: $SiH_4$ and $N_2O$ are introduced as source gases at flow rates of 5 sccm and 600 sccm, respectively, and are stabilized; the pressure in the treatment chamber is set at 25 Pa; the temperature is set at 280° C.; and plasma discharge of 30 W is performed.

As described in this embodiment, a silicon oxide layer or a silicon oxynitride layer can be formed over a silicon nitride layer without using oxidation treatment.

Embodiment 6

In this embodiment, a method for manufacturing a thin film transistor, which is one embodiment of the present invention and is different from those described in other embodiments, is described. Specifically, with the use of a resist mask having regions with different thicknesses, the number of photomasks used in manufacturing a thin film transistor can be reduced.

First, similarly to Embodiment 2, a gate insulating layer 704 is formed so as to cover a gate electrode layer 702, and a first semiconductor layer 706A, a second semiconductor layer 707A, and an impurity semiconductor layer 710A are formed over the gate insulating layer 704. Then, a conductive layer 712A is formed over the impurity semiconductor layer 710A. Note that the gate insulating layer 704 is formed including a silicon nitride layer 704A and a silicon oxide layer 704B. Note that the second semiconductor layer 707A is formed including a mixed region 708A and a region 709A including an amorphous semiconductor.

Figure 10A:
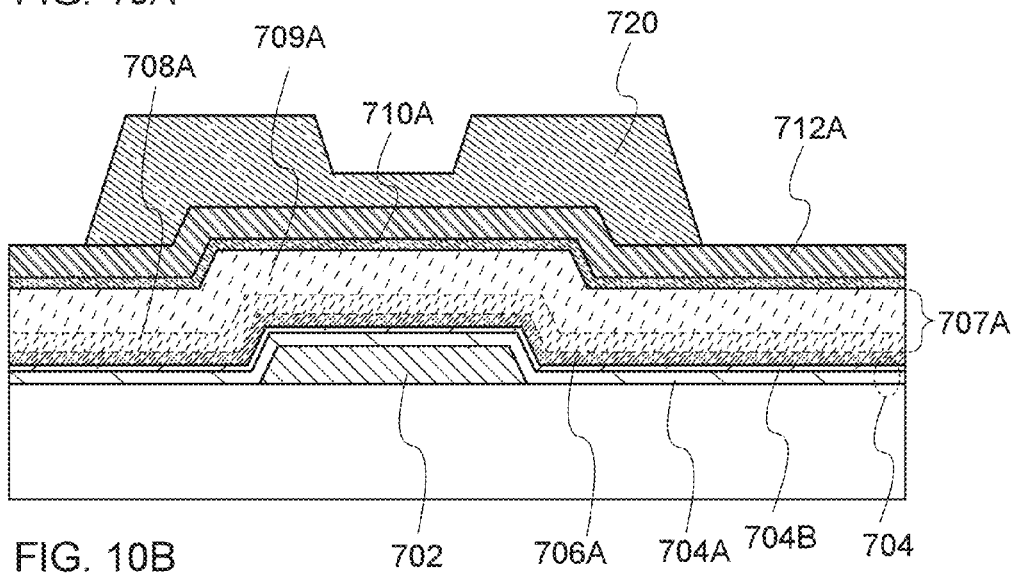
FIGS. 10A to 10C illustrate an example of a method for manufacturing a thin film transistor.

Next, a resist mask 720 is formed over the conductive layer 712A (see FIG. 10A). The resist mask 720 in this embodiment is a resist mask having a depressed portion and a projected portion. In other words, the resist mask 720 can also be referred to as a resist mask including a plurality of regions (here, two regions) with different thicknesses. A region of the resist mask 720, which has a larger thickness, is referred to as a projected portion of the resist mask 720. A region of the resist mask 720, which has a smaller thickness, is referred to as a depressed portion of the resist mask 720.

The projected portion of the resist mask 720 is formed in a region where source and drain electrode layers 712 are to be formed. The depressed portion of the resist mask 720 is formed in a region where the source and drain electrode layers 712 are not to be formed and the second semiconductor layer 707A is to be exposed.

The resist mask 720 can be formed using a multi-tone mask. Here, multi-tone masks are described below with reference to FIGS. 12A and 12B.

The multi-tone mask is a mask capable of light exposure with multi-level light intensity. For example, light exposure is performed with three levels of light intensity to provide an exposed region, a half-exposed region, and an unexposed region. With the use of the multi-tone mask, one-time light exposure and development process allow a resist mask with plural thicknesses (for example, two levels of thicknesses) to be formed. Therefore, with the use of a multi-tone mask, the number of photomasks can be reduced.

Figure 12A:
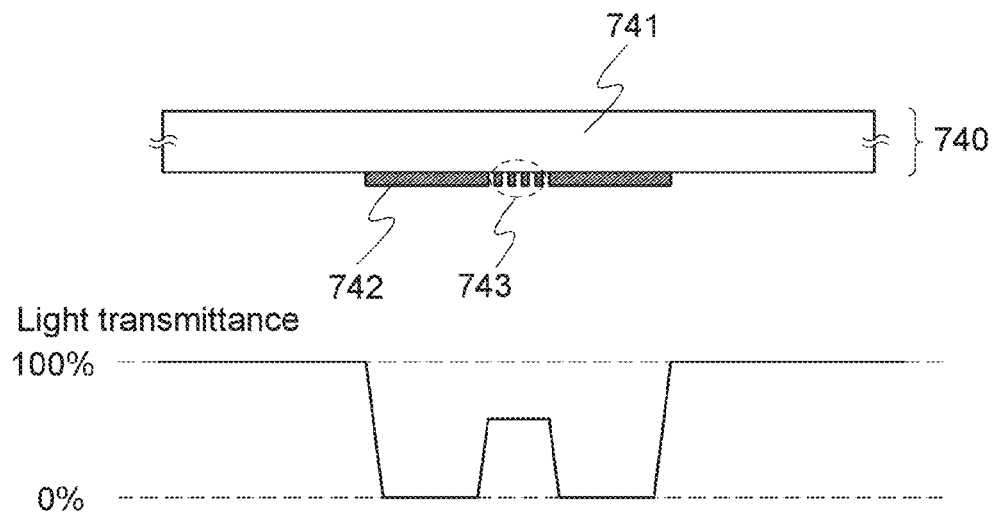
FIGS. 12A and 12B illustrate multi-tone masks.
Figure 12B:
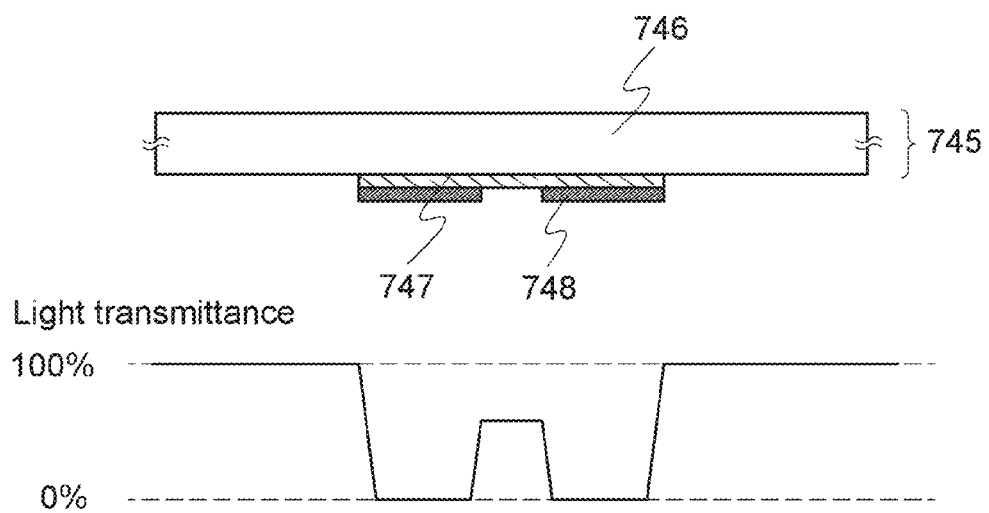

FIGS. 12A and 12B illustrate cross-sectional views of typical multi-tone masks. FIG. 12A illustrates a gray-tone mask 740 and FIG. 12B illustrates a half-tone mask 745.

The gray-tone mask 740 illustrated in FIG. 12A includes a light-blocking portion 742 formed using a light-blocking film on a substrate 741 having a light-transmitting property, and a diffraction grating portion 743 provided with a pattern of the light-blocking film.

The diffraction grating portion 743 has slits, dots, meshes, or the like which are provided at intervals less than or equal to the resolution limit of light used for light exposure, whereby the amount of light transmitted through the diffraction grating portion 743 is adjusted. Note that the slits, dots, or meshes provided at the diffraction grating portion 743 may be provided periodically or non-periodically.

As the substrate 741 having a light-transmitting property, quartz or the like can be used. The light-blocking film for forming the light-blocking portion 742 and the diffraction grating portion 743 may be formed using a metal material, and chromium, chromium oxide, or the like is preferably used.

In the case where the gray-tone mask 740 is irradiated with light for light exposure, as illustrated in FIG. 12A, the light transmittance of the region overlapping with the light-blocking portion 742 is 0%, and the light transmittance of the region where neither the light-blocking portion 742 nor the diffraction grating portion 743 is provided is 100%. Further, the light transmittance at the diffraction grating portion 743 is approximately in the range of 10% to 70%, which can be adjusted by the interval of slits, dots, meshes, or the like of the diffraction grating.

The half-tone mask 745 illustrated in FIG. 12B includes a semi-light-transmitting portion 747 formed using a semi-light-transmitting film on a substrate 746 having a light-transmitting property, and a light-blocking portion 748 formed using a light-blocking film.

The semi-light-transmitting portion 747 can be formed using a film of MoSiN, MoSi, MoSiO, MoSiON, CrSi, or the like. The light-blocking portion 748 may be formed using a metal material similar to the material of the light-blocking film of the gray-tone mask, and chromium, chromium oxide, or the like is preferably used.

In the case where the half-tone mask 745 is irradiated with light for light exposure, as illustrated in FIG. 12B, the light transmittance of the region overlapping with the light-blocking portion 748 is 0%, and the light transmittance of the region where neither the light-blocking portion 748 nor the semi-light-transmitting portion 747 is provided is 100%. Further, the light transmittance in the semi-light-transmitting portion 747 is approximately in the range of 10% to 70%, which can be adjusted by the kind, the thickness, or the like of the material to be formed.

By light exposure and development with the use of the multi-tone mask, the resist mask 720 which has regions with different thicknesses can be formed. Note that without limitation thereto, the resist mask 720 may be formed without using a multi-tone mask.

Figure 10B:
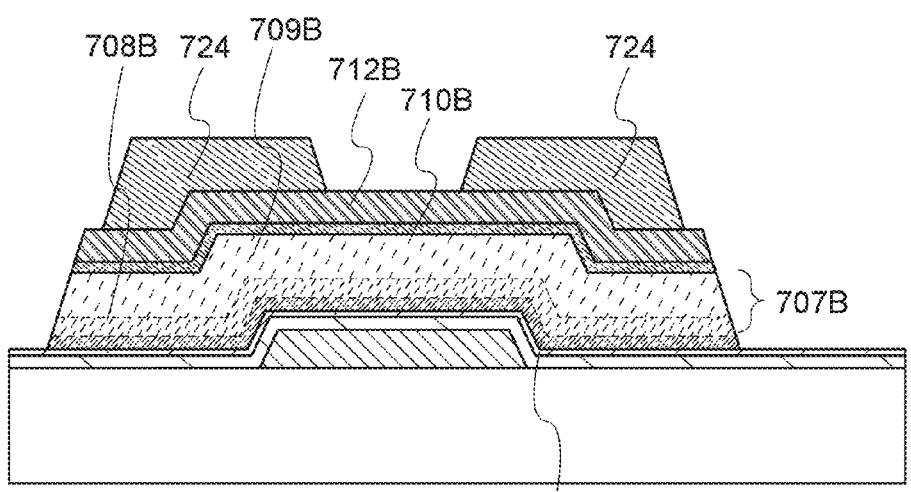

Next, etching is performed using the resist mask 720 to form a first semiconductor layer 706, a second semiconductor layer 707B, an impurity semiconductor layer 710B, and a conductive layer 712B (see FIG. 10B). Note that the second semiconductor layer 707B is formed including a mixed region 708B and a region 709B including an amorphous semiconductor.

Next, the resist mask 720 is made to recede (reduce), so that resist masks 724 are formed (see FIG. 10B). In order to make the resist mask 720 recede (reduce), ashing using oxygen plasma or the like may be performed.

Figure 10C:
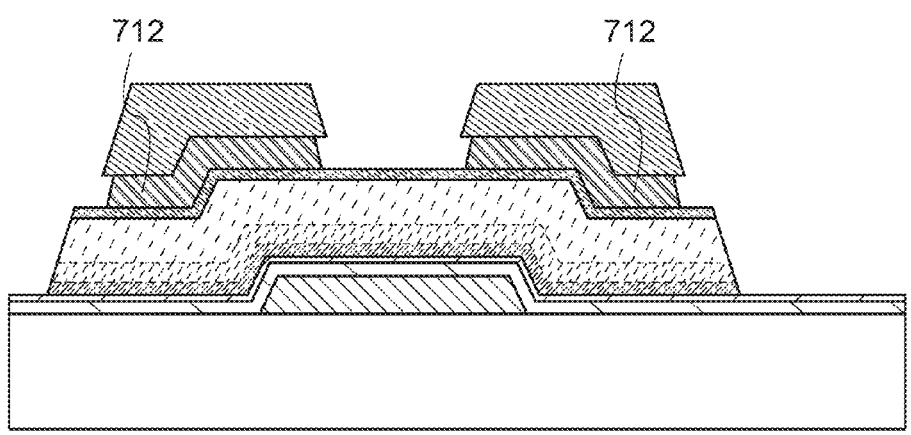

Next, the conductive layer 712B is etched using the resist masks 724 to form the source and drain electrode layers 712 (see FIG. 10C).

Figure 11A:
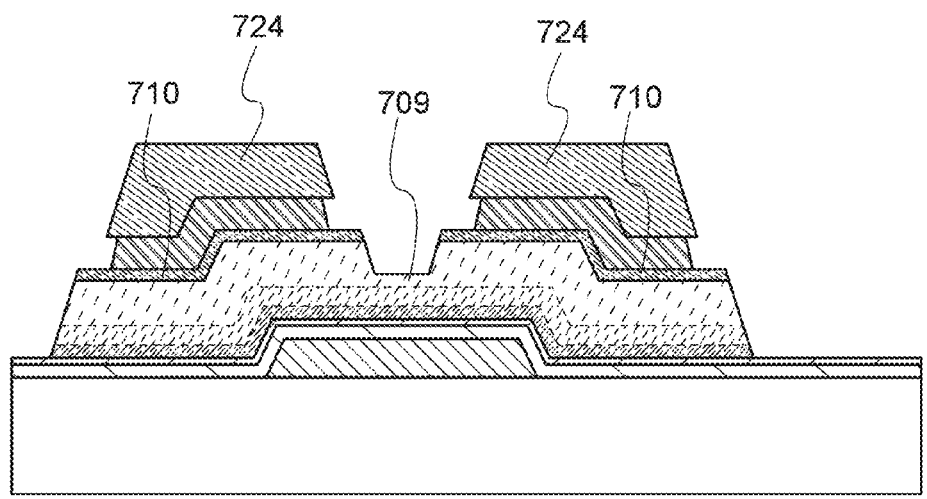
FIGS. 11A and 11B illustrate an example of a method for manufacturing a thin film transistor.
Figure 11B:
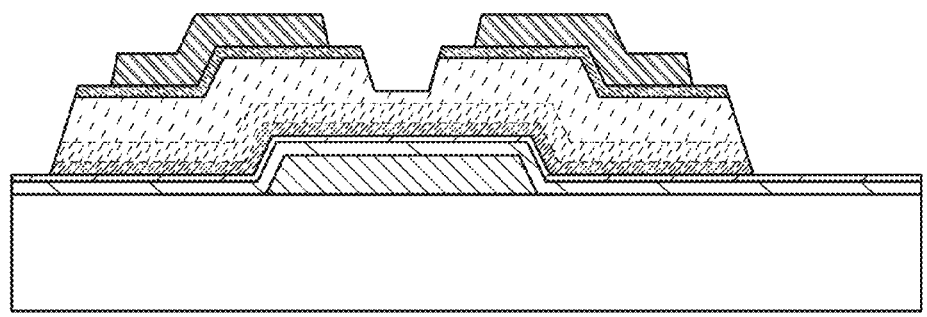

Next, the impurity semiconductor layer 710B and the second semiconductor layer 707B are partly etched, so that source and drain regions 710 and a region 709 including an amorphous semiconductor are formed (see FIG. 11A). After that, the resist masks 724 are removed (see FIG. 11B).

As described in this embodiment, a thin film transistor can be manufactured using a multi-tone mask. Accordingly, the use of the multi-tone mask makes it possible to reduce the number of photomasks to be used.

Embodiment 7

In this embodiment, one mode of a display panel or a light-emitting panel is described with reference to drawings.

In the display device or the light-emitting device of this embodiment, a signal line driver circuit and a scan line driver circuit may be formed over a different substrate (e.g., a semiconductor substrate or an SOI substrate) and then connected to a pixel portion, or may be formed over the same substrate as a pixel circuit.

Note that there are no particular limitations on the connection method of a substrate separately formed, and a known method such as a COG method, a wire bonding method, or a TAB method can be used. Further, a connection position is not limited to a particular position as long as electrical connection is possible. Moreover, a controller, a CPU, a memory, and/or the like may be formed separately and connected to the pixel circuit.

Figure 13:
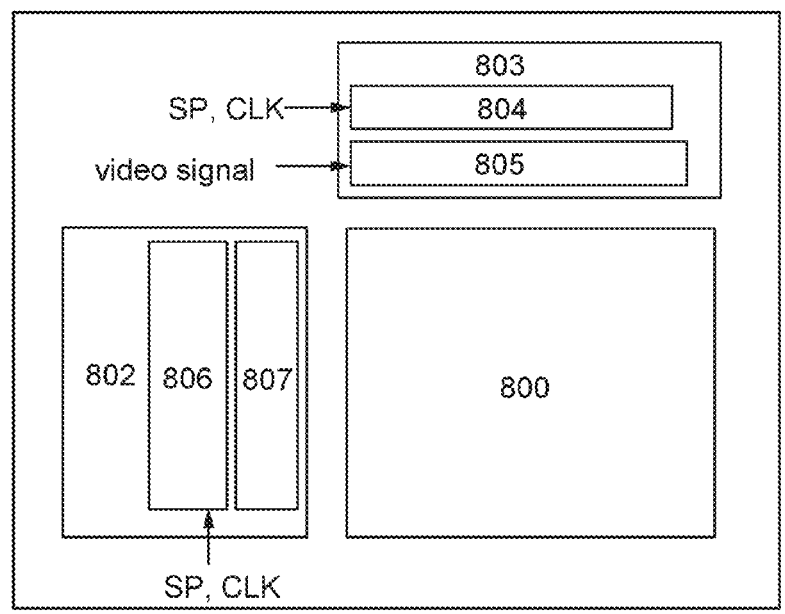
FIG. 13 illustrates an example of a display panel.

FIG. 13 illustrates a block diagram of a display device. The display device illustrated in FIG. 13 includes a pixel portion 800 including a plurality of pixels each provided with a display element, a scan line driver circuit 802 which selects each pixel, and a signal line driver circuit 803 which controls input of a video signal to a selected pixel.

Note that the display device is not limited to the mode illustrated in FIG. 13. That is, the signal line driver circuit is not limited to a mode including only a shift register and an analog switch. In addition to the shift register and the analog switch, another circuit such as a buffer, a level shifter, or a source follower may be included. Further, the shift register and the analog switch are not always required to be provided, and for example, a different circuit such as a decoder circuit by which a signal line can be selected may be used instead of the shift register, or a latch or the like may be used instead of the analog switch.

The signal line driver circuit 803 illustrated in FIG. 13 includes a shift register 804 and an analog switch 805. A clock signal (CLK) and a start pulse signal (SP) are input to the shift register 804. When the clock signal (CLK) and the start pulse signal (SP) are input, timing signals are generated in the shift register 804, and the timing signals are input to the analog switch 805.

A video signal is supplied to the analog switch 805. The analog switch 805 samples the video signal in accordance with the input timing signal and distributes the video signal to a signal line of a latter stage.

The scan line driver circuit 802 illustrated in FIG. 13 includes a shift register 806 and a buffer 807. The scan line driver circuit 802 may include a level shifter. In the scan line driver circuit 802, when the clock signal (CLK) and the start pulse signal (SP) are input to the shift register 806, a selection signal is generated. The generated selection signal is buffered and amplified in the buffer 807, and then supplied to a corresponding scan line. Gates of all pixel transistors of one line are connected to one scan line. Further, since the pixel transistors of one line should be turned on at the same time in the operation, a buffer through which large current can flow is used as the buffer 807.

In a full-color display device, when video signals corresponding to R (red), G (green), and B (blue) are sequentially sampled and supplied to a corresponding signal line, the number of terminals for connecting the shift register 804 and the analog switch 805 corresponds to approximately ⅓ of the number of terminals for connecting the analog switch 805 and the signal lines of the pixel portion 800. Accordingly, by forming the analog switch 805 and the pixel portion 800 over the same substrate, the number of terminals which are used for connection to a substrate that is formed separately can be reduced as compared to the case of forming the analog switch 805 and the pixel portion 800 over different substrates. Thus, occurrence probability of poor connection can be suppressed, and a yield can be improved.

Note that although the scan line driver circuit 802 in FIG. 13 includes the shift register 806 and the buffer 807, without limitation thereto, the scan line driver circuit 802 may be formed using only the shift register 806.

Note that the structures of the signal line driver circuit and the scan line driver circuit are not limited to the structures illustrated in FIG. 13, which are merely one mode of the display device.

Figure 14A:
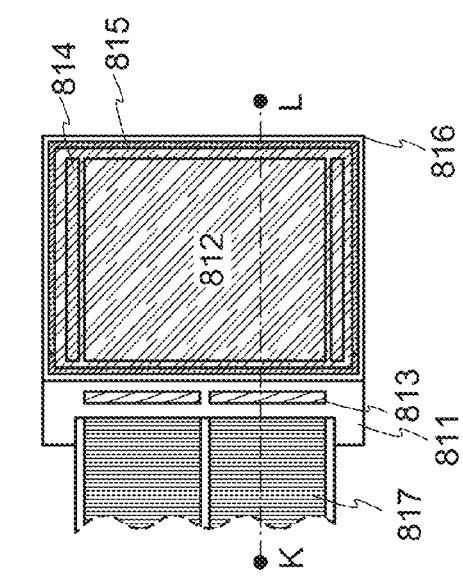
FIGS. 14A and 14B illustrate an example of a display panel.
Figure 14B:
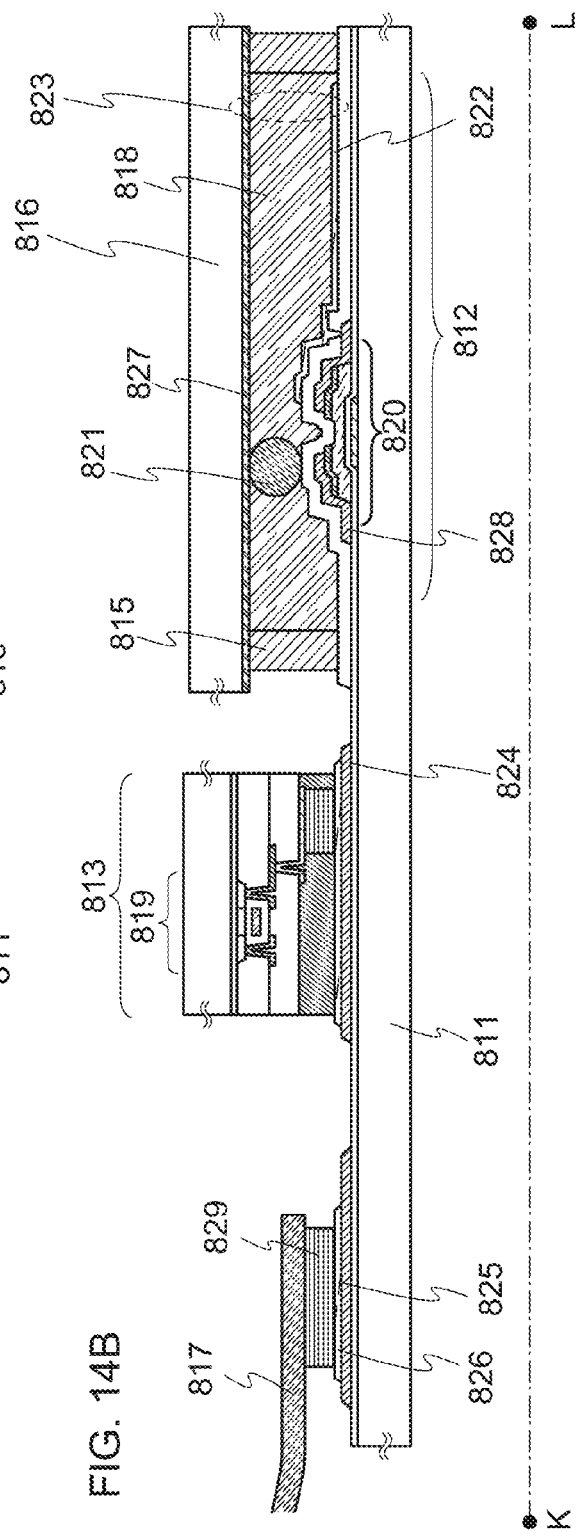
Figure 15A:
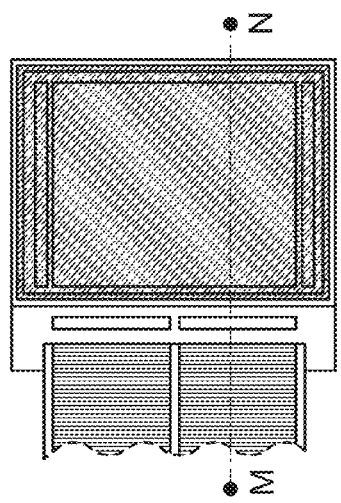
FIGS. 15A and 15B illustrate an example of a display panel.
Figure 15B:
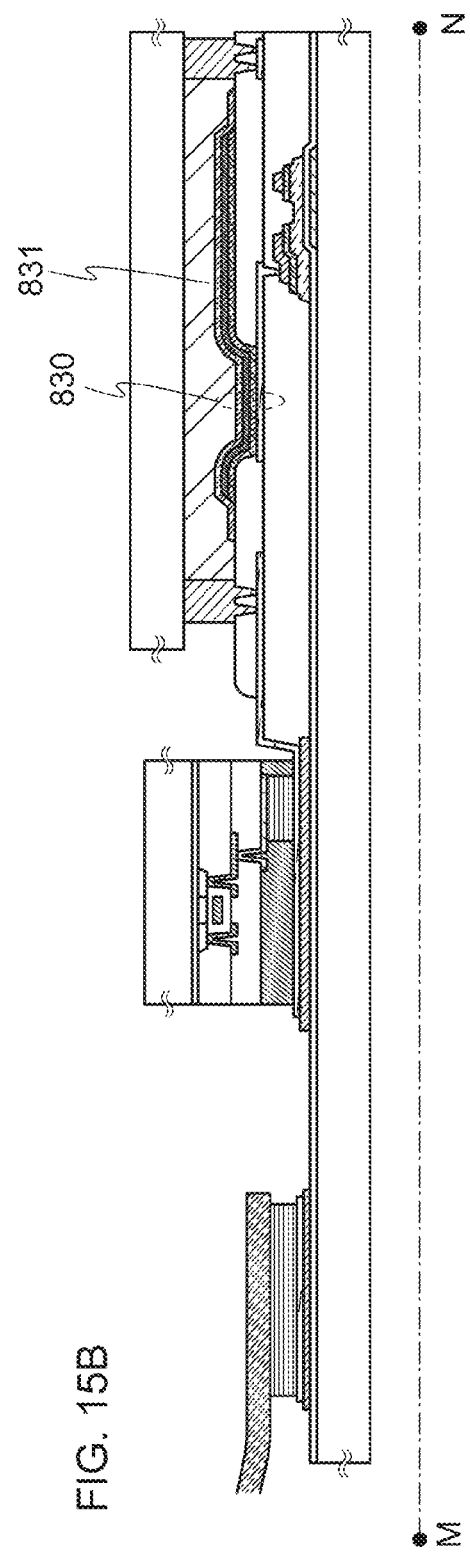

Next, appearances of a liquid crystal display panel and a light-emitting panel, each of which is one mode of the display device, are described with reference to FIGS. 14A and 1413 and FIGS. 15A and 15B. FIG. 14A is a top view of a liquid crystal display panel in which a transistor 820 including a crystalline semiconductor and a liquid crystal element 823 which are formed over a first substrate 811 are sealed with a sealant 815 between the first substrate 811 and a second substrate 816. FIG. 14B is a cross-sectional view taken along line K-L in FIG. 14A. FIGS. 15A and 15B illustrate a case of a light-emitting panel. In FIGS. 15A and 15B, only portions which are different from those in FIGS. 14A and 14B are denoted by reference numerals.

The sealant 815 is provided so as to surround a pixel portion 812 and a scan line driver circuit 814 which are provided over the first substrate 811. Further, the second substrate 816 is provided over the pixel portion 812 and the scan line driver circuit 814. Thus, the pixel portion 812 and the scan line driver circuit 814, together with a liquid crystal layer 818 or a filler 831, are sealed with the first substrate 811, the sealant 815, and the second substrate 816. Note that a signal line driver circuit 813 is mounted on a region over the first substrate 811, which is different from the region surrounded by the sealant 815. Note that the signal line driver circuit 813 is formed using a transistor including a crystalline semiconductor formed over a substrate separately prepared. Note that although an example in which the signal line driver circuit 813 formed using a transistor including a crystalline semiconductor is attached to the first substrate 811 is described in this embodiment, a signal line driver circuit is preferably formed using a transistor including a single crystal semiconductor and attached. FIG. 14B illustrates, as an example, a transistor 819 formed using a crystalline semiconductor, which is included in the signal line driver circuit 813.

The pixel portion 812 provided over the first substrate 811 includes a plurality of thin film transistors, and in FIG. 14B, a transistor 820 included in the pixel portion 812 is illustrated. In addition, the signal line driver circuit 813 also includes a plurality of thin film transistors, and in FIG. 14B, the transistor 819 included in the signal line driver circuit 813 is illustrated. In the light-emitting device of this embodiment, the transistor 820 may be a driving transistor, a current control transistor, or an erasing transistor. The transistor 820 corresponds to the transistor described in Embodiment 1.

Note that a pixel electrode 822 included in the liquid crystal element 823 is electrically connected to the transistor 820 through a wiring 828. A counter electrode 827 of the liquid crystal element 823 is formed on the second substrate 816. The liquid crystal element 823 corresponds to a region where the pixel electrode 822, the counter electrode 827, and the liquid crystal layer 818 are stacked.

Further, a pixel electrode included in a light-emitting element 830 is electrically connected to a source or drain electrode of the transistor 820 through a wiring. In addition, in this embodiment, a common electrode of the light-emitting element 830 and a conductive material layer having a light-transmitting property are electrically connected to each other. Note that the structure of the light-emitting element 830 is not limited to that described in this embodiment. The structure of the light-emitting element 830 can be determined in accordance with the direction of light taken from the light-emitting element 830, polarity of the transistor 820, or the like.

Note that as a material of each of the first substrate 811 and the second substrate 816, glass, metal (typically stainless steel), ceramics, plastics, or the like can be used. As plastics, a fiberglass reinforced plastic (FRP) plate, a polyvinyl fluoride (PVF) film, a polyester film, an acrylic resin film, or the like can be used. Alternatively, a sheet in which aluminum foil is interposed between PVF films or polyester films may also be used.

A spacer 821 is a bead spacer and is provided to control a distance (a cell gap) between the pixel electrode 822 and the counter electrode 827. Further, a spacer (a post spacer) which is obtained by selectively etching an insulating layer may also be used.

A variety of signals (potentials) are supplied to the signal line driver circuit 813 which is formed separately, the scan line driver circuit 814, and the pixel portion 812 from a flexible printed circuit (FPC) 817 through a lead wiring 824 and a lead wiring 825.

In this embodiment, a connection terminal 826 is formed of the same conductive layer as the pixel electrode 822 included in the liquid crystal element 823. Further, the lead wiring 824 and the lead wiring 825 are formed of the same conductive layer as the wiring 828.

The connection terminal 826 is electrically connected to a terminal included in the FPC 817 through an anisotropic conductive layer 829.

Note that although not illustrated, the liquid crystal display device described in this embodiment includes alignment films and polarizing plates, and may also include a color filter, a light-blocking layer, or the like.

In this embodiment, the connection terminal 826 is formed of the same conductive layer as the pixel electrode included in the light-emitting element 830. In addition, the lead wiring 825 is formed of the same conductive layer as the wiring 828. However, the present invention is not limited to this embodiment.

As the second substrate located in the direction in which light is extracted from the light-emitting element 830, a light-transmitting substrate is used. In this case, a substrate formed of a light-transmitting material such as a glass substrate, a plastic substrate, a polyester film, or an acrylic film is used. When light is extracted from the light-emitting element 830 in the direction of the first substrate, a light-transmitting substrate is used as the first substrate.

As the filler 831, an inert gas such as nitrogen or argon, an ultraviolet curable resin, a thermosetting resin, or the like can be used. For example, polyvinyl chloride (PVC), acrylic, polyimide, an epoxy resin, a silicone resin, polyvinyl butyral (PVB), or ethylene vinyl acetate (EVA) can be used. In this embodiment, for example, nitrogen may be used.

An optical film such as a polarizing plate, a circular polarizing plate (including an elliptical polarizing plate), a retardation plate (a quarter-wave plate or a half-wave plate), or a color filter may be provided as appropriate over a light-emitting surface of the light-emitting element. Further, a polarizing plate or a circularly polarizing plate may be provided with an anti-reflection layer.

Embodiment 8

The present invention disclosed in Embodiments 1 to 7 can be applied to a variety of electronic devices (including game machines). Examples of electronic devices include a television set (also referred to as a television or a television receiver), a monitor of a computer, electronic paper, a camera such as a digital camera or a digital video camera, a digital photo frame, a mobile phone set (also referred to as a cellular phone or a mobile phone device), a portable game console, a portable information terminal, an audio reproducing device, a large-sized game machine such as a pachinko machine, and the like.

The present invention disclosed in Embodiments 1 to 7 can be applied to, for example, electronic paper. Electronic paper can be used for electronic devices of a variety of fields as long as they display data. For example, electronic paper can be applied to an electronic book (e-book) reader, a poster, an advertisement in a vehicle such as a train, displays of various cards such as a credit card, and the like. An example of such electronic devices is illustrated in FIG. 16A.

Figure 16A:
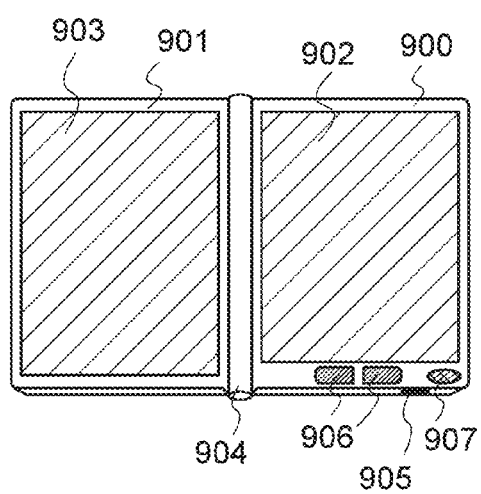
FIGS. 16A to 16D each illustrate an electronic device.

FIG. 16A illustrates an example of an electronic book reader. The electronic book reader illustrated in FIG. 16A includes a housing 900 and a housing 901. The housing 900 and the housing 901 are combined with each other by a hinge 904 so that the electronic book can be opened and closed. With such a structure, the electronic book reader can be handled like a paper book.

A display portion 902 is incorporated in the housing 900, and a display portion 903 is incorporated in the housing 901. The display portion 902 and the display portion 903 may display one image or different images. In the structure where different images are displayed on the display portion 902 and the display portion 903, for example, the right display portion (the display portion 902 in FIG. 16A) can display text and the left display portion (the display portion 903 in FIG. 16A) can display images. The display device described in Embodiment 7 can be applied to the display portions 902 and 903.

FIG. 16A illustrates an example in which the housing 900 is provided with an operation portion and the like. For example, the housing 900 is provided with a power input terminal 905, an operation key 906, a speaker 907, and the like. The page can be turned with the operation key 906, for example. Note that a keyboard, a pointing device, or the like may be provided on the surface of the housing, on which the display portion is provided. Further, an external connection terminal (e.g., an earphone terminal, a USB terminal, or a terminal which can be connected to a variety of cables such as a USB cable), a recording medium insertion portion, or the like may be provided on a back surface or a side surface of the housing. Furthermore, the electronic book reader illustrated in FIG. 16A may have a function of an electronic dictionary.

The electronic book reader illustrated in FIG. 16A may be configured to transmit and receive data wirelessly. Through wireless communication, desired book data or the like can be purchased and downloaded from an electronic book server.

Figure 16B:
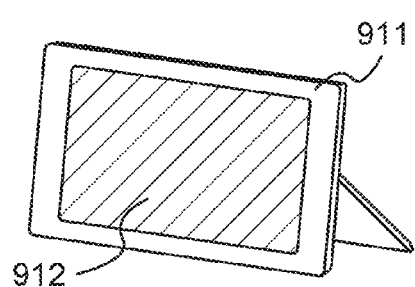

FIG. 16B illustrates an example of a digital photo frame. For example, in the digital photo frame illustrated in FIG. 16B, a display portion 912 is incorporated in a housing 911. The display portion 912 can display a variety of images. For example, the display portion 912 can display data of an image shot with a digital camera or the like and function as a normal photo frame. The display device described in Embodiment 7 can be applied to the display portion 912.

Note that the digital photo frame illustrated in FIG. 16B may be provided with an operation portion, an external connection terminal (a USB terminal, a terminal which can be connected to a variety of cables such as a USB cable, and the like), a recording medium insertion portion, and the like. Although these components may be provided on the surface on which the display portion is provided, it is preferable to provide them on the side surface or the back surface for the design of the digital photo frame. For example, a memory storing data of an image shot with a digital camera is inserted in the recording medium insertion portion of the digital photo frame, whereby the image data can be downloaded and displayed on the display portion 912.

The digital photo frame illustrated in FIG. 16B may be configured to transmit and receive data wirelessly. The structure may be employed in which desired image data is transferred wirelessly to be displayed.

Figure 16C:
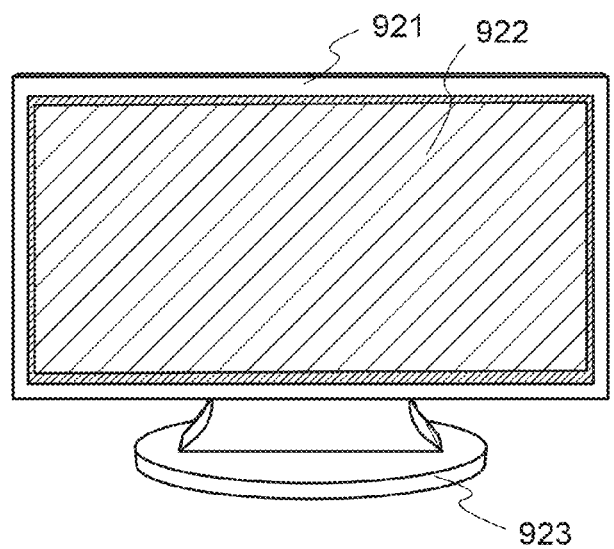

FIG. 16C illustrates an example of a television set. In the television set illustrated in FIG. 16C, a display portion 922 is incorporated in a housing 921. Images can be displayed on the display portion 922. Here, the housing 921 is supported by a stand 923. The display device described in Embodiment 7 can be applied to the display portion 922.

The television set illustrated in FIG. 16C can be operated with an operation switch of the housing 921 or a separate remote controller. Channels and volume can be controlled by an operation key of the remote controller so that an image displayed on the display portion 922 can be controlled. Further, the remote controller may be provided with a display portion for displaying data output from the remote controller.

Note that the television set illustrated in FIG. 16C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver or between receivers) data communication can be performed.

Figure 16D:
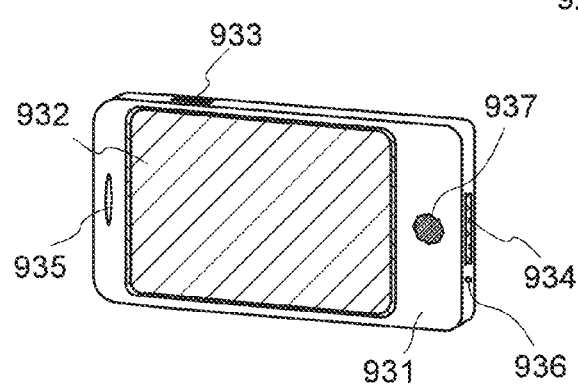

FIG. 16D illustrates an example of a mobile phone set. The mobile phone set illustrated in FIG. 16D is provided with a display portion 932 incorporated in a housing 931, operation buttons 933 and 937, an external connection port 934, a speaker 935, a microphone 936, and the like. The display device described in Embodiment 7 can be applied to the display portion 932.

The display portion 932 of the mobile phone set illustrated in FIG. 16D may be a touch panel. When the display portion 932 is touched with a finger or the like, contents displayed on the display portion 932 can be controlled. In this case, operations such as making a phone call and texting can be performed by touching the display portion 932 with a finger or the like.

There are mainly three screen modes of the display portion 932. The first mode is a display mode mainly for displaying images. The second mode is an input mode mainly for inputting data such as text. The third mode is a display-and-input mode in which two modes of the display mode and the input mode are combined.

For example, in the case of making a phone call or texting, a text input mode mainly for inputting text is selected for the display portion 932 and text input operation can be performed on the screen. In this case, it is preferable to display a keyboard or number buttons on almost the entire screen of the display portion 932.

When a detection device including a sensor for detecting inclination, such as a gyroscope or an acceleration sensor, is provided inside the mobile phone set illustrated in FIG. 16D, display on the screen of the display portion 932 can be automatically switched by determining the orientation of the mobile phone set (whether the mobile phone set is placed horizontally or vertically for a landscape mode or a portrait mode).

The screen modes may be switched by touching the display portion 932 or operating the operation button 937 of the housing 931. Alternatively, the screen modes may be switched depending on the kind of the image displayed on the display portion 932. For example, when a signal of an image displayed on the display portion is the one of moving image data, the screen mode is switched to the display mode. When the signal is the one of text data, the screen mode is switched to the input mode.

Further, in the input mode, when input by touching the display portion 932 is not performed for a certain period while a signal is detected by an optical sensor in the display portion 932, the screen mode may be controlled so as to be switched from the input mode to the display mode.

The display portion 932 can also function as an image sensor. For example, an image of a palm print, a fingerprint, or the like is taken by an image sensor when the display portion 932 is touched with a palm or a finger, whereby personal authentication can be performed. Further, when a backlight that emits near-infrared light or a sensing light source that emits near-infrared light is provided in the display portion, an image of a finger vein, a palm vein, or the like can be taken.

Figure 17A:
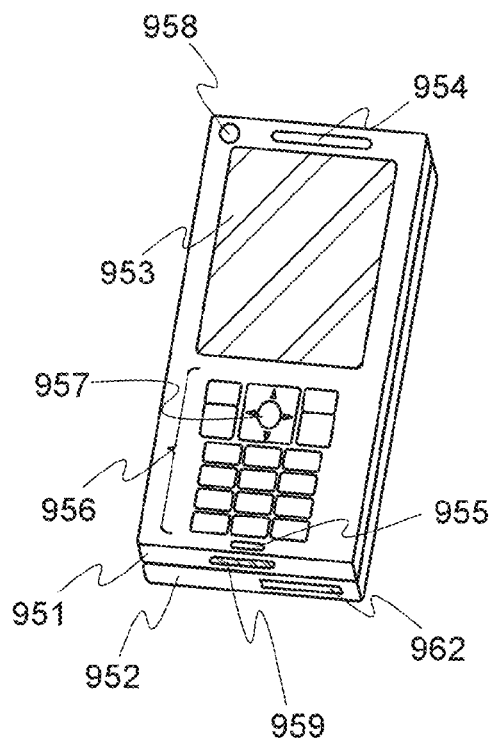
FIGS. 17A to 17C illustrate an electronic device.
Figure 17B:
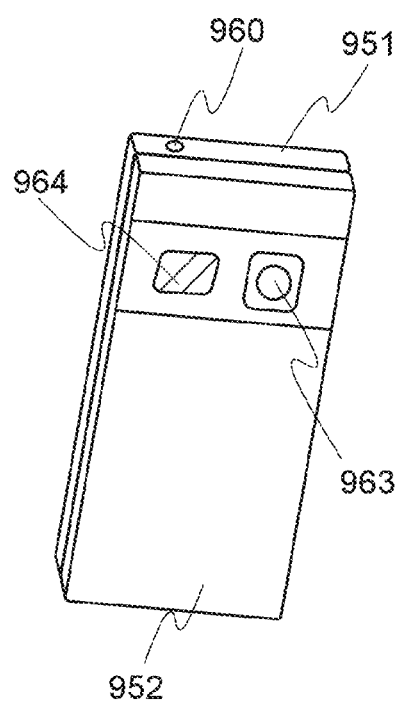
Figure 17C:
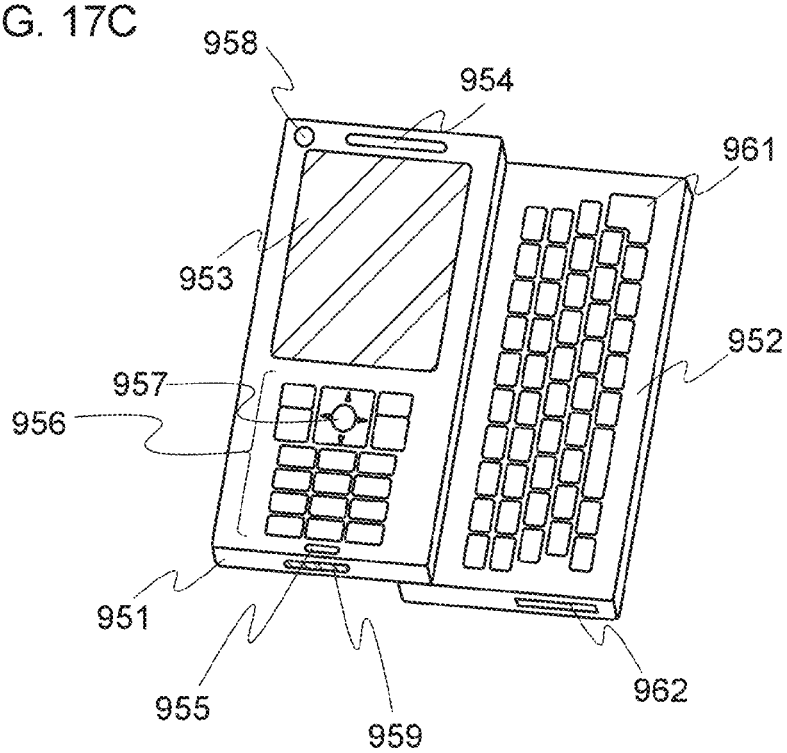

FIGS. 17A to 17C illustrate an example of a mobile phone. FIG. 17A is a front view, FIG. 17B is a rear view, and FIG. 17C is a front view in which two housings are slid. The mobile phone illustrated in FIGS. 17A to 17C includes two housings: a housing 951 and a housing 952. The mobile phone has both functions of a mobile phone and a portable information terminal and incorporates a computer, which is a so-called smartphone capable of a variety of data processing in addition to voice calls.

The housing 951 includes a display portion 953, a speaker 954, a microphone 955, operation keys 956, a pointing device 957, a front camera lens 958, a jack 959 for an external connection terminal, an earphone terminal 960, and the like. The housing 952 includes a keyboard 961, an external memory slot 962, a rear camera 963, a light 964, and the like. In addition, an antenna is built in the housing 951.

Further, in addition to the above components, a non-contact IC chip, a small size memory device, or the like may be incorporated in the mobile phone.

The housings 951 and 952 which overlap with each other (illustrated in FIG. 17A) can be slid and are developed by being slid as illustrated in FIG. 17C. The display panel or the display device to which the invention described in any of Embodiments 1 to 7 is applied can be incorporated in the display portion 953. Since the front camera lens 958 is provided in the same plane as the display portion 953, the mobile phone can be used as a videophone. Further, a still image and a moving image can be taken with the rear camera 963 and the light 964 by using the display portion 953 as a viewfinder.

By using the speaker 954 and the microphone 955, the mobile phone can be used as an audio recording device (sound recorder) or an audio reproducing device. With the use of the operation keys 956, operation of incoming and outgoing of phone calls, simple information input such as electronic mail, scrolling of a screen, cursor movement for selecting information to be displayed on the display portion, and the like are possible.

When much information is handled in documentation, use as a portable information terminal, and the like, it is convenient to use the keyboard 961. By sliding the housings 951 and 952 which overlap with each other (FIG. 17A), the housings 951 and 952 can be developed as illustrated in FIG. 17C. When the mobile phone is used as a portable information terminal, a cursor can be moved smoothly with the use of the keyboard 961 and the pointing device 957. An AC adaptor and various types of cables such as a USB cable can be connected to the jack 959 for an external connection terminal, and charging and data communication with a personal computer or the like are possible. Further, by inserting a recording medium in the external memory slot 962, a larger amount of data can be stored and transferred.

The rear surface of the housing 952 (FIG. 17B) is provided with the rear camera 963 and the light 964, and a still image and a moving image can be taken using the display portion 953 as a viewfinder.

Further, the mobile phone may have an infrared communication function, a USB port, a function of receiving one segment television broadcast, a non-contact IC chip, an earphone jack, or the like, in addition to the aforementioned functions and structures.

As described above, the invention disclosed in Embodiments 1 to 7 can be applied to a variety of electronic devices.

Example 1

In Embodiment 1, exposure to air was described as an example of oxidation treatment on a silicon nitride layer. In this example, a result is described which is obtained by evaluating a silicon nitride layer which is exposed to air after formed over a substrate by X-ray photoelectron spectroscopy (XPS). Note that depth measured by the XPS in this example was approximately 2 nm.

In this example, the thickness of the silicon nitride layer was 100 nm. The silicon nitride layer was formed as follows: a $SiH_4$ gas, an $NH_3$ gas, and an Ar gas were introduced as source gases at flow rates of 5 sccm, 400 sccm, and 50 sccm, respectively, and were stabilized; the pressure in the treatment chamber was set to 30 Pa; the substrate temperature was set to 280° C.; and plasma discharge of 500 W was performed using the RF power source frequency of 27 MHz. Note that a parallel plate plasma CVD apparatus was used in film formation, in which a distance between an upper electrode and a lower electrode was 20 mm.

Figure 18:
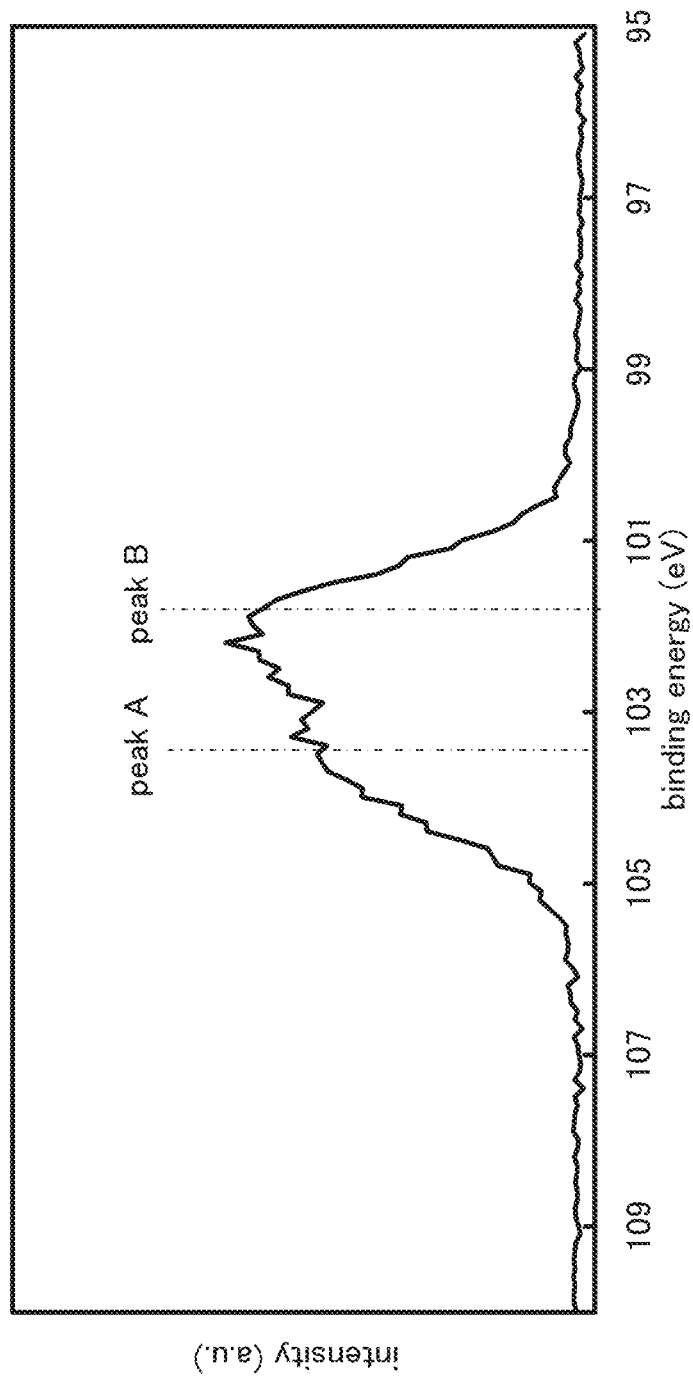
FIG. 18 illustrates a measurement result of XPS.

FIG. 18 shows a photoelectron spectroscopy spectrum of Si-2p. In FIG. 18, the horizontal axis represents the bond energy of Si-2p and the vertical axis represents the spectrum intensity. Since the peak position of the photoelectron spectroscopy spectrum is determined depending on the electron state of elements, the peak position depends on the bonding state. The bonding state of Si can be confirmed from the photoelectron spectroscopy spectrum of Si-2p in FIG. 18.

A peak A in FIG. 18 is derived from Si—O bonding (derived from $SiO_2$) and a peak B is derived from Si—N bonding (derived from $Si_3N_4$). Since the photoelectron spectroscopy spectrum of Si-2p in FIG. 18 includes the peak derived from the Si—O bonding, it can be said that a surface of the silicon nitride layer includes the Si—O bonding. Accordingly, it can be said that the surface of the silicon nitride layer is oxidized.

Example 2

In this example, nitrogen concentrations and oxygen concentrations of the interface between the gate insulating layer 404 and the first semiconductor layer 406, the first semiconductor layer 406, the second semiconductor layer 407, and the impurity semiconductor layer serving as the source and drain regions 410, all of which are included in the thin film transistor illustrated in FIG. 1A, are described with reference to FIG. 19.

First, a process for forming a sample is described. Note that formation conditions of only the gate insulating layer 404, the first semiconductor layer 406, the second semiconductor layer 407, and the impurity semiconductor layer serving as the source and drain regions 410 are described here.

A silicon nitride layer with a thickness of 300 nm was formed over a glass substrate.

Here, as the glass substrate, a glass substrate with a thickness of 0.7 mm (EAGLE2000, manufactured by Corning, Inc.) was used.

The silicon nitride layer was formed under following conditions: as for the source gases, the flow rate of $SiH_4$ was set to 40 sccm, the flow rate of $H_2$ was set to 500 sccm, the flow rate of $N_2$ was set to 550 sccm, and the flow rate of $NH_3$ was set to 140 sccm; the pressure in the treatment chamber was set to 100 Pa; the substrate temperature was set to 280° C.; and plasma discharge was performed using the RF power source frequency of 13.56 MHz and power of the RF power source of 370 W.

Next, the glass substrate was transferred to a load lock chamber, the silicon nitride layer was exposed to air for approximately 5 minutes, and thus the surface of the silicon nitride layer was oxidized to form a silicon oxide layer. Then, after cleaning of the treatment chamber of the plasma CVD apparatus, a protective layer was formed.

Here, after the treatment chamber was cleaned with nitrogen fluoride, an amorphous silicon layer was formed as a protective layer on an inner wall of the treatment chamber. The amorphous silicon layer was formed as follows: the flow rate of $SiH_4$, which was a source gas, was set to 300 sccm; the pressure in the treatment chamber was set to 160 Pa; the temperature in the treatment chamber was set to 280° C.; and plasma discharge was performed using the RF power source frequency of 13.56 MHz and power of the RF power source of 120 W.

Next, after the glass substrate was transferred to the treatment chamber, the first semiconductor layer 406, the second semiconductor layer 407, and the impurity semiconductor layer were stacked over the silicon oxide layer in this order. Here, a microcrystalline silicon layer with a thickness of 30 nm was formed as the first semiconductor layer 406. A silicon layer with a thickness of 175 nm was formed as the second semiconductor layer 407. An amorphous silicon layer including phosphorus with a thickness of 50 nm was formed as the impurity semiconductor layer.

The first semiconductor layer 406 was formed under following conditions: as for the source gases, the flow rate of a $SiH_4$ gas was set to 5 sccm, the flow rate of an $H_2$ gas was set to 1500 sccm, and the flow rate of an Ar gas was set to 1500 sccm; the pressure in the treatment chamber was set to 280 Pa; the substrate temperature was set to 280° C.; and plasma discharge was performed using the RF power source frequency of 13.56 MHz and power of the RF power source of 50 W.

The second semiconductor layer 407 was formed under following conditions: as for the source gases, the flow rate of a $SiH_4$ gas was set to 40 sccm, the flow rate of an $H_2$ gas was set to 1475 sccm, the flow rate of 1000 ppm $NH_3$ gas (diluted with an $H_2$ gas) was set to 25 sccm, and the flow rate of an Ar gas was set to 2000 sccm; the pressure in the treatment chamber was set to 280 Pa; the substrate temperature was 280° C.; and plasma discharge was performed using the RF power source frequency of 13.56 MHz and power of the RF power source of 100 W.

The impurity semiconductor layer was formed under following conditions: as for source gases, the flow rate of $SiH_4$ was set to 100 sccm and the flow rate of 0.5% $PH_3$ (diluted with an $H_2$ gas) was set to 170 sccm; the pressure was set to 170 Pa; the substrate temperature was set to 280° C.; and plasma discharge was performed using the RF power source frequency of 13.56 MHz and the power of the RF power source of 60 W.

Figure 19:
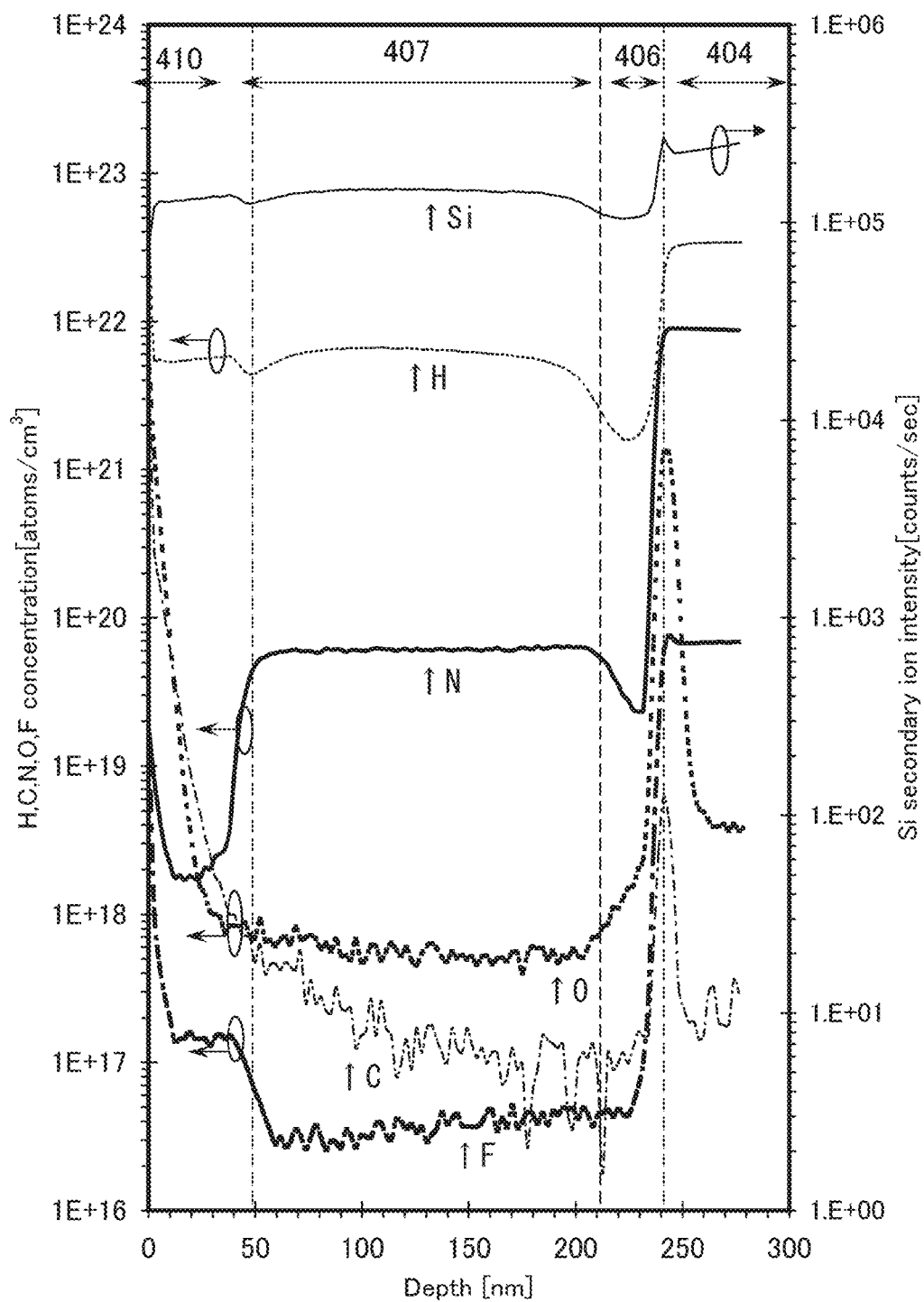
FIG. 19 illustrates concentrations of elements included in a gate insulating layer, a first semiconductor layer, and a second semiconductor layer.

FIG. 19 shows results of an analysis by secondary ion mass spectrometry of the sample. The horizontal axis represents the depth from the surface of the sample. The vertical axis on the left side represents the concentrations of hydrogen, carbon, nitrogen, oxygen, and fluorine. The vertical axis on the right side represents the secondary ion intensity of silicon. A depressed portion at a depth of approximately 45 nm to 50 nm in the secondary ion intensity of silicon is an interface between the second semiconductor layer 407 and the impurity semiconductor layer. A peak portion at a depth of approximately 240 nm to 245 nm in the secondary ion intensity of silicon is an interface between the gate insulating layer 404 and the first semiconductor layer 406. Here, the thickness of the first semiconductor layer 406 is approximately 30 nm; therefore, an interface between the first semiconductor layer 406 and the second semiconductor layer 407 is estimated at a depth of approximately 210 nm to 215 nm.

In this example, the nitrogen concentration sharply decreases at the interface between the gate insulating layer 404 and the first semiconductor layer 406 and then gradually increases toward the second semiconductor layer 407. That is, the nitrogen concentration reaches the minimum value in the first semiconductor layer 406 and keeps substantially constant in the second semiconductor layer 407. The oxygen concentration sharply increases at the interface between the gate insulating layer 404 and the first semiconductor layer 406 and soon decreases. The oxygen concentration gradually decreases toward the second semiconductor layer 407 and keeps substantially constant in the second semiconductor layer 407.

The nitrogen concentration at the interface between the gate insulating layer 404 and the first semiconductor layer 406 (that is, the nitrogen concentration before rapid decrease) is $8 \times 10^{19}$ atoms/cm$^3$. The minimum value of the nitrogen concentration in the first semiconductor layer 406 is $2 \times 10^{19}$ atoms/cm$^3$. The nitrogen concentration in the second semiconductor layer 407 is $6 \times 10^{19}$ atoms/cm$^3$.

The oxygen concentration at the interface between the gate insulating layer 404 and the first semiconductor layer 406 is $1 \times 10^{21}$ atoms/cm$^3$. The oxygen concentration in the second semiconductor layer 407 is lower than a lower limit of the detection.

As described above, when the gate insulating layer 404 is formed using the silicon nitride layer and the silicon oxide layer which is formed by oxidizing the surface of the silicon nitride layer, the peak of the oxygen concentration lies at the interface between the gate insulating layer 404 and the first semiconductor layer 406 and the minimum value of the nitrogen concentration lies in the first semiconductor layer 406. The nitrogen concentration is substantially constant in the second semiconductor layer 407.

Example 3

Figure 20A:
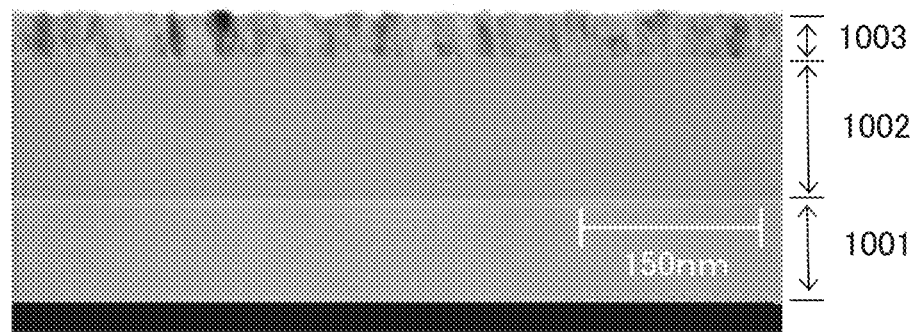
FIGS. 20A to 20C are cross-sectional STEM images described in Example 3.
Figure 20B:
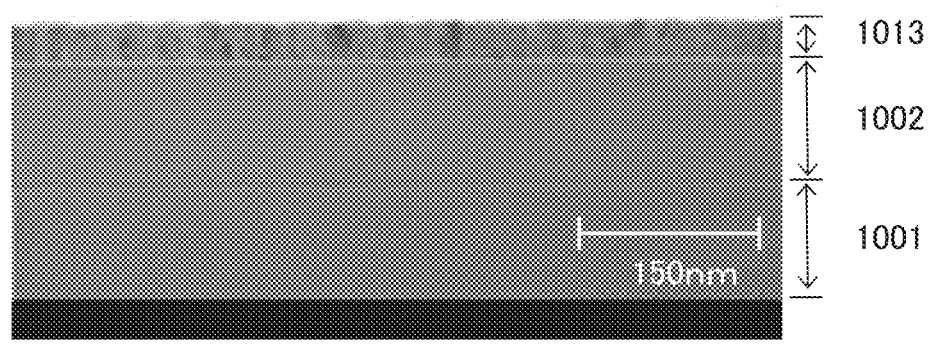
Figure 20C:
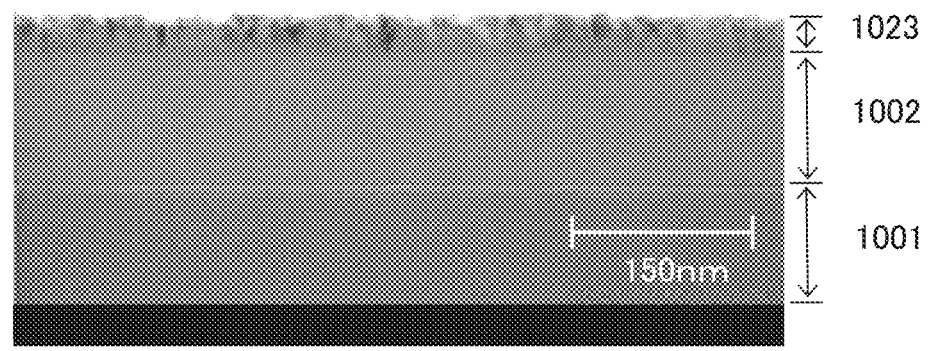

In this example, cross-sectional STEM (scanning transmission electron microscopy) images of samples which are each formed by stacking the gate insulating layer and the first semiconductor layer are shown in FIGS. 20A to 20C.

A process for forming samples 1 to 3 is described.

First, a silicon nitride layer with a thickness of 100 nm was formed over a glass substrate 1001.

As the glass substrate, a glass substrate with a thickness of 0.7 mm (EAGLE2000, manufactured by Corning, Inc.) was used.

The silicon nitride layer was formed under the similar conditions to those for forming the silicon nitride layer described in Example 2.

Then, oxidation treatment was performed on the surface of the silicon nitride layer.

Similarly to Example 2, the oxidation treatment of the sample 1 was performed in such a manner that the surface of the silicon nitride layer was exposed to air for approximately 5 minutes after the substrate was transferred from the treatment chamber to the load lock chamber. Thus, the silicon oxide layer was formed on the silicon nitride layer; and thus, a gate insulating layer 1002 was formed.

The oxidation treatment of the sample 2 was performed in such a manner that the surface of the silicon nitride layer was exposed to an oxygen plasma atmosphere for approximately 60 seconds in the treatment chamber where the silicon nitride layer had been formed. Thus, the silicon oxide layer was formed on the silicon nitride layer.

As a comparative example, the sample 3 was not subjected to oxidation treatment on the surface of the silicon nitride layer.

Next, the first semiconductor layer was formed.

As for the sample 1, similarly to Example 2, the treatment chamber was cleaned, a protective layer was formed on the treatment chamber, and the substrate was transferred to the treatment chamber; thus, a microcrystalline silicon layer with a thickness of 30 nm was formed as a first semiconductor layer 1003 under similar conditions to those of the first semiconductor layer of Example 2.

As for the sample 2, in the treatment chamber where the oxidation treatment was performed, a microcrystalline silicon layer with a thickness of 30 nm was formed as a first semiconductor layer 1013 under similar conditions to those of the first semiconductor layer of Example 2.

As for the sample 3, after the substrate was transferred from the treatment chamber to the load lock chamber which was held in a vacuum, the treatment chamber was cleaned in a similar manner to that in Example 2, and a protective film was formed on an inner wall of the treatment chamber. Next, the substrate was transferred from the load lock chamber to the treatment chamber, and a microcrystalline silicon layer with a thickness of 30 nm was formed as a first semiconductor layer 1023 under similar conditions to those of the first semiconductor layer of Example 2.

Each of FIGS. 20A to 20C is a cross section of the samples 1 to 3.

Crystal grain boundaries are observed at the interface between the first semiconductor layer 1003 and the gate insulating layer 1002 in the STEM image in FIG. 20A and at the interface between the first semiconductor layer 1013 and the gate insulating layer 1002 in the STEM image in FIG. 20B. Therefore, it is found that crystals can grow from the interface between the gate insulating layer 1002 and the first semiconductor layer 1003 or the interface between the gate insulating layer 1002 and the first semiconductor layer 1013 when a silicon oxide layer is formed on the outermost surface of the gate insulating layer 1002.

On the other hand, in the STEM image in FIG. 20C, a crystal grain boundary is not observed at the interface between the first semiconductor layer 1023 and the gate insulating layer 1002 and in the vicinity thereof. Accordingly, in the case where the outermost surface of the gate insulating layer 1002 is a silicon nitride layer, it is found that amorphous silicon is deposited at an early stage of the deposition of the first semiconductor layer 1023.

Example 4

In this example, effects that a base layer has on crystallinity of a microcrystalline semiconductor layer which is formed as a first semiconductor layer are described with reference to calculation results. Here, a microcrystalline silicon layer is used as a typical example of the microcrystalline semiconductor layer.

In this example, a crystallization process of Si in the case where an impurity element (an N atom or an O atom) was included was calculated using classical molecular dynamics simulation. An empirical potential which characterizes the interaction between atoms is defined in the classical molecular dynamics simulation, so that force that acts on each atom is evaluated. A law of classical mechanics is applied to each atom and Newton's equation of motion is numerically solved, whereby motion (time-dependent change) of each atom can be deterministically tracked.

Here, in order to investigate the crystal growth of Si after a crystal nucleus of Si is generated in an a-Si layer, calculation models were made for the case where the a-Si layer does not include any impurity element and the case where the a-Si layer includes an impurity element (an N atom or an O atom) (see FIGS. 21A to 21C).

FIG. 21A illustrates a model in which a crystal nucleus 1111 is generated in an a-Si layer 1110 which does not include an impurity element and single crystal silicon with a plane orientation (100) grows from the crystal nucleus 1111. Note that the a-Si layer 1110 includes a Si atom 1113.

FIG. 21B illustrates a model in which the crystal nucleus 1111 is generated in the a-Si layer 1110 which includes N atoms 1115 as an impurity element at 0.5 atomic %, that is, at a concentration of approximately $2.5 \times 10^{20}$ atoms/cm$^3$ and single crystal silicon with a plane orientation (100) grows from the crystal nucleus 1111.

FIG. 21C illustrates a model in which the crystal nucleus 1111 is generated in the a-Si layer 1110 which includes O atoms 1117 as an impurity element at 0.5 atomic %, that is, at a concentration of approximately $2.5 \times 10^{20}$ atoms/cm$^3$ and single crystal silicon with a plane orientation (100) grows from the crystal nucleus 1111.

Classical molecular dynamics simulation was performed at 1025° C. on the above three calculation models illustrated in FIGS. 21A to 21C.

Figure 22A:
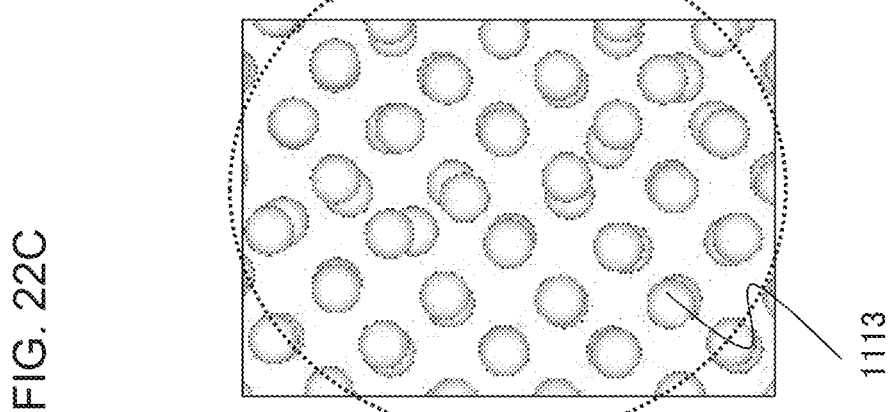
FIGS. 22A to 22C illustrate simulation results of a crystallization process of a microcrystalline semiconductor layer.
Figure 22B:
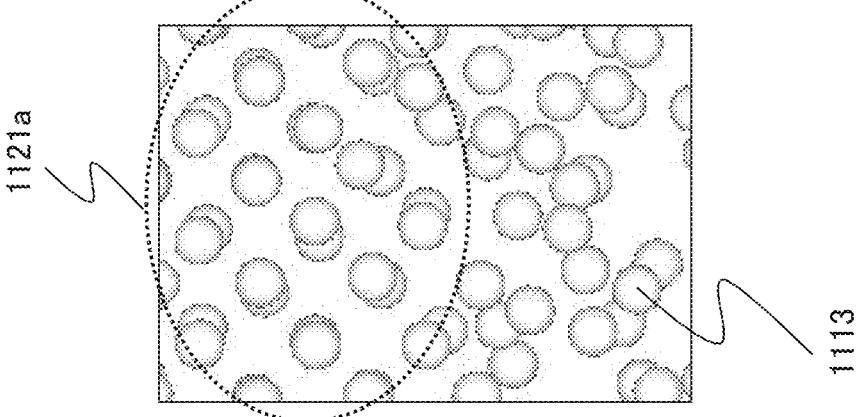
Figure 22C:
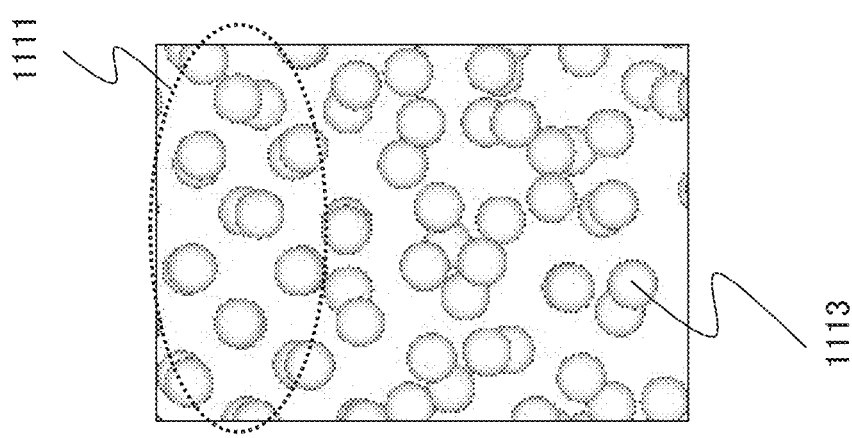

FIGS. 22A to 22C illustrate calculation results of change of the structure of FIG. 21A. FIG. 22A shows a model at 0 seconds. FIG. 22B shows a model after 0.5 nanoseconds. FIG. 22C shows a model after 1 nanosecond.

Figure 23A:
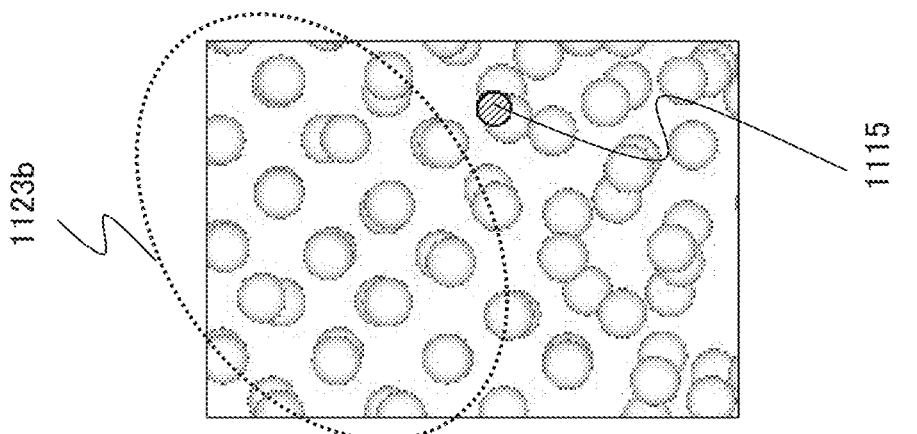
FIGS. 23A to 23C illustrate simulation results of a crystallization process of a microcrystalline semiconductor layer.
Figure 23B:
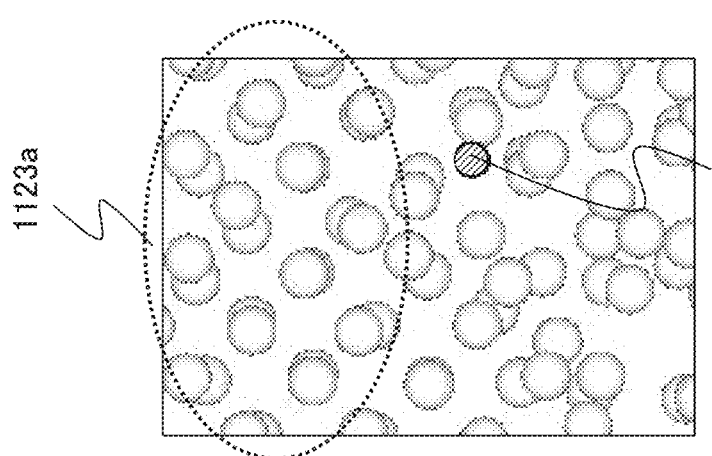
Figure 23C:
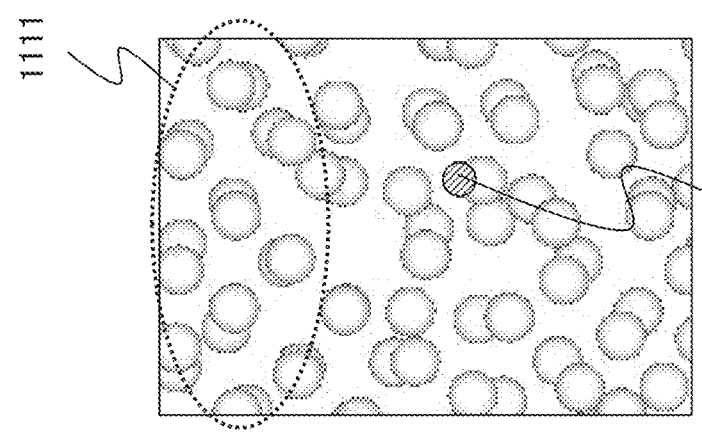

FIGS. 23A to 23C illustrate calculation results of change of the structure of FIG. 21B. FIG. 23A shows a model at 0 seconds. FIG. 23B shows a model after 1 nanosecond. FIG. 23C shows a model after 2 nanoseconds.

Figure 24A:
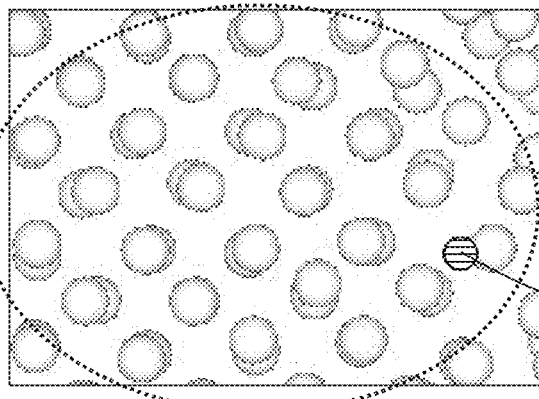
FIGS. 24A to 24C illustrate simulation results of a crystallization process of a microcrystalline semiconductor layer.
Figure 24B:
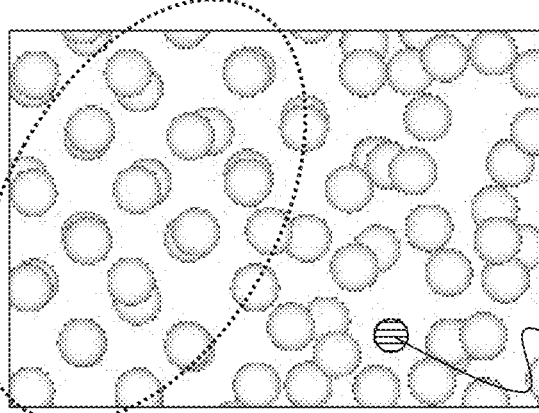
Figure 24C:
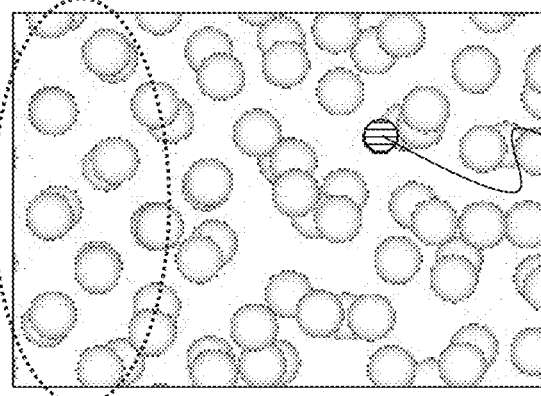

FIGS. 24A to 24C illustrate calculation results of change of the structure of FIG. 21C. FIG. 24A shows a model at 0 seconds. FIG. 24B shows a model after 0.5 nanoseconds, FIG. 24C shows a model after 1 nanosecond.

Table 1 shows crystal growth rates of Si in each calculation model.

TABLE 1

| Impurity element | Crystal growth rate (nm/ns) |
|---|---|
| ① None | 1.1 |
| ② Nitrogen | 0.21 |
| ③ Oxygen | 0.80 |

The crystal nucleus 1111 in FIG. 22A spreads to a crystal region 1121a of single crystal silicon in FIG. 22B and to a crystal region 1121b of single crystal silicon in FIG. 22C. Thus, it is found that the Si atom 1113 grows to be a crystal in the case where the a-Si layer does not include an impurity element.

In the case where the a-Si layer includes an N atom, the crystal nucleus 1111 in FIG. 23A spreads to a crystal region 1123a of single crystal silicon in FIG. 23B and to a crystal region 1123b of single crystal silicon in FIG. 23C. However, it is found that the crystal region is smaller and the crystal growth rate is slower as compared to the case illustrated in FIGS. 22A to 22C, where an impurity element is not included. Note that as illustrated in FIGS. 23B and 23C, the crystal growth is inhibited due to the N atom 1115 in the a-Si layer and the N atom 1115 is not incorporated in the crystal region 1123a and the crystal region 1123b of the single crystal silicon but exists in the vicinity of the crystal grain boundary.

In the case where the a-Si layer includes the O atom 1117, the crystal nucleus 1111 in FIG. 24A spreads to a crystal region 1125a of single crystal silicon in FIG. 24B and to a crystal region 1125b of single crystal silicon in FIG. 24C. However, the crystal region is smaller and the crystal growth rate is slower as compared to the case illustrated in FIGS. 22A to 22C, where an impurity element is not included. As compared to the case illustrated in FIGS. 23A to 23C, where an N atom is included, the crystal region is larger and the crystal growth rate is faster. In addition, as illustrated in FIG. 24C, it is found that the O atom 1117 is incorporated in the crystal region 1125b of single crystal silicon and the crystallinity of the entire film is relatively good. Accordingly, it is considered that crystallinity of Si is not greatly affected when the oxygen concentration in the film is high to some extent but crystallinity of Si decreases when the nitrogen concentration is high.

Accordingly, when a silicon oxide layer is formed as a base layer of a microcrystalline semiconductor layer, crystallinity and a crystal growth rate of the microcrystalline semiconductor layer can be increased.

This application is based on Japanese Patent Application serial no. 2009-152370 filed with Japan Patent Office on Jun. 26, 2009, the entire contents of which are hereby incorporated by reference.

What is claimed is:

1. A method for manufacturing a thin film transistor, comprising:
   forming a gate electrode;
   forming a gate insulating layer using silicon nitride, over the gate electrode;
   oxidizing a surface of the gate insulating layer;
   forming a semiconductor layer including a microcrystalline semiconductor layer over the gate insulating layer; and
   forming a source region and a drain region in contact with the semiconductor layer,
   wherein a nitrogen concentration at an interface between the gate insulating layer and the microcrystalline semiconductor layer is higher than or equal to $5 \times 10^{19}$ atoms/cm$^3$ and lower than or equal to $1 \times 10^{22}$ atoms/cm$^3$, and
   wherein the nitrogen concentration in the microcrystalline semiconductor layer reaches a minimum value which is lower than or equal to $3 \times 10^{19}$ atoms/cm$^3$.

2. The method for manufacturing a thin film transistor according to claim 1, wherein the oxidizing step is performed by plasma treatment using a gas containing oxygen.

3. The method for manufacturing a thin film transistor according to claim 1, wherein the thin film transistor is incorporated in one selected from the group consisting of an electronic book reader, a digital photo frame, a television set, and a mobile phone.

4. The method for manufacturing a thin film transistor according to claim 1, wherein the microcrystalline semiconductor layer is silicon.

5. The method for manufacturing a thin film transistor according to claim 2, wherein a surface wave plasma is used in the plasma treatment.

6. A method for manufacturing a thin film transistor, comprising:
- forming a gate electrode;
- forming a gate insulating layer using silicon nitride, over the gate electrode;
- oxidizing a surface of the gate insulating layer in a same chamber as the gate insulating layer is formed;
- forming a semiconductor layer including a microcrystalline semiconductor layer over the gate insulating layer; and
- forming a source region and a drain region in contact with the semiconductor layer,
- wherein a nitrogen concentration at an interface between the gate insulating layer and the microcrystalline semiconductor layer is higher than or equal to $5 \times 10^{19}$ atoms/cm$^3$ and lower than or equal to $1 \times 10^{22}$ atoms/cm$^3$, and
- wherein the nitrogen concentration in the microcrystalline semiconductor layer reaches a minimum value which is lower than or equal to $3 \times 10^{19}$ atoms/cm$^3$.

7. The method for manufacturing a thin film transistor according to claim 6, wherein the oxidizing step is performed by plasma treatment using a gas containing oxygen.

8. The method for manufacturing a thin film transistor according to claim 6, wherein the thin film transistor is incorporated in one selected from the group consisting of an electronic book reader, a digital photo frame, a television set, and a mobile phone.

9. The method for manufacturing a thin film transistor according to claim 6, wherein the microcrystalline semiconductor layer is silicon.

10. The method for manufacturing a thin film transistor according to claim 7, wherein a surface wave plasma is used in the plasma treatment.

* * * * *